(12) United States Patent
Yi et al.

(10) Patent No.: US 6,948,993 B2
(45) Date of Patent: Sep. 27, 2005

(54) METHOD OF FABRICATING ORGANIC ELECTROLUMINESCENT DISPLAYS HAVING A STACKED INSULATING LAYER WITH HALFTONE PATTERN

(75) Inventors: Seung-jun Yi, Seoul (KR); Kyung-hee Choi, Seoul (KR); Do-hyun Choi, Seoul (KR); Young-chan Choi, Kyonggi-Do (KR)

(73) Assignee: Daewoo Electronics Service Co., Ltd., Seoul (KR)

( * ) Notice: Subject to any disclaimer, the term of this patent is extended or adjusted under 35 U.S.C. 154(b) by 155 days.

(21) Appl. No.: 10/243,829

(22) Filed: Sep. 16, 2002

(65) Prior Publication Data

US 2003/0052596 A1 Mar. 20, 2003

(30) Foreign Application Priority Data

Sep. 15, 2001 (KR) .................................... 2001-0057046
Aug. 2, 2002 (KR) .................................... 2002-0045940

(51) Int. Cl.$^7$ ................................................ H01J 9/00
(52) U.S. Cl. .............................. 445/24; 445/25; 427/66
(58) Field of Search ................................ 313/504, 506, 313/509; 445/24, 25; 427/66

(56) References Cited

U.S. PATENT DOCUMENTS

| | | | |
|---|---|---|---|
| 4,769,292 A | 9/1988 | Tang et al. | 428/690 |
| 5,294,870 A | 3/1994 | Tang et al. | 313/504 |
| 5,399,502 A | 3/1995 | Friend et al. | 438/22 |
| 5,701,055 A * | 12/1997 | Nagayama et al. | 313/504 |
| 5,807,627 A | 9/1998 | Friend et al. | 428/212 |
| 6,097,147 A | 8/2000 | Baldo et al. | 313/506 |
| 6,117,529 A * | 9/2000 | Leising et al. | 313/504 |
| 6,611,095 B2 * | 8/2003 | Kim | 313/506 |
| 6,653,779 B1 * | 11/2003 | Lu | 313/505 |
| 6,756,739 B2 * | 6/2004 | Miyake et al. | 313/504 |

FOREIGN PATENT DOCUMENTS

JP 215989 8/2000

* cited by examiner

*Primary Examiner*—Mariceli Santiago
(74) *Attorney, Agent, or Firm*—Birch Stewart Kolasch & Birch LLP

(57) ABSTRACT

An organic EL display and fabricating method thereof enable a reduction in a process time by simplifying a fabricating process in a manner that a pattern of a single insulating layer is formed so as to have both functions of insulator and separator, increase an aperture ratio, and reduce a product cost. A plurality of stripe type first electrodes are provided on a transparent substrate, an insulating layer pattern is stacked on the transparent substrate and the first electrodes so as to cross with the first electrodes, a half tone pattern of insulator is stacked on the transparent substrate between the insulating layer pattern and between the first electrodes, a plurality of organic light-emitting layers are provided on a plurality of the first electrodes, respectively, and a plurality of second electrodes are provided on a plurality of the organic light-emitting layers

23 Claims, 25 Drawing Sheets

METHOD OF FABRICATING ORGANIC ELECTROLUMINESCENT DISPLAYS HAVING A STACKED INSULATING LAYER WITH HALFTONE PATTERN

BACKGROUND OF THE INVENTION

1. Field of the Invention

The present invention relates to an organic electroluminescence display, and more particularly, to an organic electroluminescence display and a fabricating method thereof enabling to simplify a fabricating process by forming a single insulating layer pattern having functions of an insulating layer and barrier ribs, upgrade an image quality by increasing an aperture ratio, and reduce a product cost.

2. Background of the Related Art

Generally, an organic electroluminescence (hereinafter abbreviated EL) display is one of flat panel displays, includes an organic EL layer inserted between anode and cathode layers on a substrate so as to be thin, and can be formed like a matrix type. Different from a plasma display panel(PDP) as another emissive display requiring a high driving voltage over 200V, the organic EL display as an emissive display can be driven by a low voltage below 15V so as to be suitable for a portable device. Compared to TFT-LCD as a non-emissive display, the organic EL display has higher brightness and wider viewing angle as well as more excellent characteristics such as a response time below about 1 μsec and the like. Specifically, the organic EL display has the response time more excellent than those of other flat panel displays, thereby being very suitable for an IMT-2000 mobile phone to which a function of moving pictures is essential.

Yet, since an organic EL layer and a cathode layer of such an organic EL display are vulnerable to oxygen and moisture, surroundings of a fabrication process should be made airtight in order to secure a reliability of the organic EL display. Hence, the fabrication process is unable in general to use photolithography for pixellation or patterning.

Therefore, pixellation of organic and cathode layers of the organic EL display uses direct pixellation using a shadow mask instead of photolithography including masking/etching processes exposed to oxygen and moisture. Yet, such a method is inadaptable to use if a pitch between pixels, i.e. an interval between lines of the organic and cathode layers, is reduced so as to realize high resolution.

There is another method of patterning the organic EL display, which is carried out in a manner that a cathode layer is patterned using a separator after an insulating layer and a separator have been formed with an electrically insulating material on an anode layer and a substrate.

In this case, the insulating layer is formed on an entire area except a dot-like opening area of the anode layer. The insulating layer defines pixels, inhibits leakage current from edges of the cathode, and prevents the cathode and anode layers from being short-circuited at a boundary between the cathode and anode layers since the stacked organic layer becomes thinner near the separator due to a shadow effect by the separator in a direction vertical to the anode layer formed for patterning of the cathode layer.

The separator formed on the insulating layer crosses with the anode layer to be arranged so as to leave an interval from each other as well as has an overhang structure so as not to make the cathode layer be short-circuited with an adjacent component. Specifically, unlike a general patterning process, a negative profile should be maintained in order to prevent short-circuit between adjacent cathode layer lines. If the separator is missing, there is a chance to be short-circuited with an adjacent pixel.

In order to fabricate the organic EL display stably, both of the insulating layer and separator are necessary. Yet, each process requires photolithography, thereby becoming complicated as well as increasing a product cost of the organic EL display.

A method of fabricating an organic EL display according to a related art is explained in detail by referring to the attached drawings as follows.

FIGS. 1A to 1C illustrate layouts of an organic EL display according to a related art.

Referring to FIG. 1A, a plurality of first electrodes 2 formed of ITO(indium tin oxide) or the like are arranged like a stripe type on a transparent substrate 1.

Referring to FIG. 1B, a lattice type insulating layer pattern 3 is stacked on the first electrodes 2 and transparent substrate 1 in an area between the first electrodes 1 and an area crossing with the first electrodes 2 except dot-like openings on the first electrodes 2.

Referring to FIG. 1C, separators 4 are formed on the insulating layer pattern 3 between the dot-like openings so as to cross with the first electrodes 2. Although not shown in the drawing, an organic EL layer and second electrodes (cathode layer) are stacked on the first electrodes 2 including the insulating layer pattern 3 and separators 4.

FIGS. 2A to 2C illustrate cross-sectional views of a method of fabricating an organic EL display along cutting lines A–A' in FIGS. 1A to 1C according to a related art.

Referring to FIG. 2A, an anode layer(not shown in the drawing) formed of ITO(indium tin oxide) or the like is stacked with a predetermined thickness on a transparent substrate 1 by sputtering. A photoresist layer(not shown in the drawing) is coated on the entirely-deposited anode layer. Exposure and development are carried out on the photoresist layer using a mask so as to form a stripe type photoresist pattern(not shown in the drawing). The entirely-deposited anode layer is etched using the photoresist pattern. And, the photoresist pattern is removed so as to form stripe type patterns of first electrodes 2.

Referring to FIG. 2B, an insulating layer(not shown in the drawing) is stacked for electric insulation on the transparent substrate 1 including the first electrodes 2. The insulating layer can be formed with organic or inorganic material. The organic material uses resin or photoresist including acrylic-, novolac-, or epoxy-based material. And, the inorganic material uses silicon oxide, silicon nitride, silicon oxinitride, or the like. The insulating layer is patterned so as to form a lattice type insulating layer pattern 3 on the first electrodes 2 and transparent substrate 1 except the dot-like openings formed on the first electrodes 2.

Referring to FIG. 2C, a negative type organic photoresist layer(not shown in the drawing) is stacked on the insulating layer pattern 3 using an electrically insulating material, and then a patterning process is carried out so as to form separators 4 having a negative profile. In this case, the separators 4 are arranged on the insulating layer pattern 3 between the dot-like openings so as to cross with the first electrodes 2, and has an overhang structure so as to prevent second electrodes 6 from being short-circuited with adjacent components. And, an organic EL layer 5 and second electrodes 6 are stacked in order using a shadow mask(not shown in the drawing).

In order to protect the organic EL layer and second electrodes(cathode layer) and the like vulnerable to moisture and oxygen, an encapsulation layer formed of metal, glass, or the like or a passivation layer formed of inorganic or organic material is formed on an entire surface including the second electrodes 6 so as to make the organic EL display airtight from outside.

FIGS. 3A to 3C illustrate cross-sectional views of a method of fabricating an organic EL display along cutting lines B–B' in FIGS. 1A to 1C according to a related art.

FIGS. 4A to 4C illustrate layouts of an organic EL display according to another related art.

Referring to FIG. 4A, a plurality of first electrodes 2 formed of ITO(indium tin oxide) or the like are arranged like a stripe type on a transparent substrate 1.

Referring to FIG. 4B, a stripe type insulating layer pattern 3 is stacked on the transparent substrate 1 and an area crossing with the first electrodes 2 on the first electrodes 2.

Referring to FIG. 4C, a photoresist layer 7 is formed on the transparent substrate 1 including the first electrodes 2 and insulating layer pattern 3. The photoresist layer 7 fails to cover openings 8 exposing the first electrodes 2 and middle portions of the insulating layer pattern 3 in the same direction of the insulating layer pattern 3. Trenches 9 are then formed by etching the exposed middle portions of the insulating layer pattern 3 with a predetermined thickness. Thus, the photoresist layer 7 exposes the openings on the first electrodes 2 so as to construct a lattice shape overall. An organic EL layer formed on the first electrodes 2 including the openings 8 and second electrodes(cathode layer) are not shown in the drawing.

FIGS. 5A to 5C illustrate cross-sectional views of a method of fabricating an organic EL display along cutting lines A–A' in FIGS. 4A to 4C according to another related art.

Referring to FIG. 5A, an anode layer(no t shown in the drawing) formed of ITO(indium tin oxide) or the like is stacked with a predetermined thickness on a transparent substrate 1 by sputtering. A photoresist layer(not shown in the drawing) is coated on the entirely-deposited anode layer. Exposure and development are carried out on the photoresist layer using a mask so as to form a stripe type photoresist pattern (not shown in the drawing). The anode layer is etched using the photoresist pattern. And, the photoresist pattern is removed so as to form stripe type patterns of first electrodes 2.

An insulating layer(not shown in the drawing) is stacked for electric insulation on the transparent substrate 1 including the first electrodes 2. The insulating layer is formed with silicon oxide, silicon nitride, silicon oxinitride, or the like by vacuum deposition such as sputtering, chemical vapor deposition, or the like. The insulating layer is patterned by photolithography so as to form insulating layer patterns 3, which are arranged to leave an interval from each other so as to cross with a plurality of the first electrodes 2.

Referring to FIG. 5B, a positive type photoresist layer 7 is stacked on the insulating layer patterns 3 using an electrically insulating material, and then exposure and development are carried out on the photoresist layer 7 so as to form openings exposing the first electrodes 2 as well as expose middle portions of the insulating patterns 3 in parallel with the insulating patterns 3, respectively.

Referring to FIG. 5C, trenches 9 are formed by etching the middle portions of the insulating patterns 3 using the patterned photoresist layer 7, respectively. A cross-section of each of the trenches 9 looks rectangular. Yet, the cross-section is a trapezoid or a half-circle. And, the structure of the trench 9 prevents short-circuit between the adjacent second electrodes(cathode layer).

And, an organic EL layer(not shown in the drawing) and second electrodes(not shown in the drawing) are stacked in order.

In order to protect the organic EL layer and second electrodes(cathode layer) and the like vulnerable to moisture and oxygen, an encapsulation layer formed of metal, glass, or the like or a passivation layer formed of inorganic or organic material is formed on an entire surface including the second electrodes so as to be isolated from outside.

Unfortunately, the method of fabricating the organic EL display according to the related art has the following problems or disadvantages.

The patterns of the insulating layer define pixels, inhibit leakage current from edges of the cathode, and prevent the cathode and anode layers from being short-circuited at a boundary between the cathode and anode layers since the stacked organic layer becomes thinner near the separator due to a shadow effect by the separator in a direction vertical to the anode layer formed for patterning of the cathode layer. The separator formed on the insulating layer crosses with the anode layer to be arranged so as to leave an interval from each other as well as has an overhang structure so as not to make the cathode layer be short-circuited with an adjacent component. Specifically, unlike a general patterning process, a negative profile should be maintained in order to prevent short-circuit between adjacent cathode layer lines. In order to fabricate the organic EL display stably, both of the insulating layer and separator are necessary. Yet, each process requires photolithography, thereby being complicated as well as increasing a product cost of the organic EL display.

SUMMARY OF THE INVENTION

Accordingly, the present invention is directed to an organic EL display and fabricating method thereof that substantially obviate one or more problems due to limitations and disadvantages of the related art.

An object of the present invention is to provide an organic EL display and fabricating method thereof enabling to reduce a process time by simplifying a fabricating process in a manner that a pattern of a single insulating layer is formed so as to have both functions of insulator and separator, increase an aperture ratio, and reduce a product cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence display according to the present invention includes a plurality of stripe type first electrodes on a transparent substrate, an insulating layer pattern stacked on the transparent substrate and the first electrodes so as to cross with the first electrodes, a half tone pattern of insulator stacked on the transparent substrate between the insulating layer pattern and between the first electrodes, a plurality of organic light-emitting layers on a plurality of the first electrodes, respectively, and a plurality of second electrodes on a plurality of the organic light-emitting layers.

In another aspect of the present invention, a method of fabricating an organic electroluminescence display includes the steps of forming a plurality of stripe type first electrodes on a transparent substrate, stacking an insulating layer pattern on a first area crossing with the first electrodes and a second area in parallel with the first electrodes wherein a half tone pattern is formed on the second area, forming a plurality of organic light-emitting layers on a plurality of the first electrodes, respectively, and forming a plurality of second electrodes on a plurality of the organic light-emitting layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
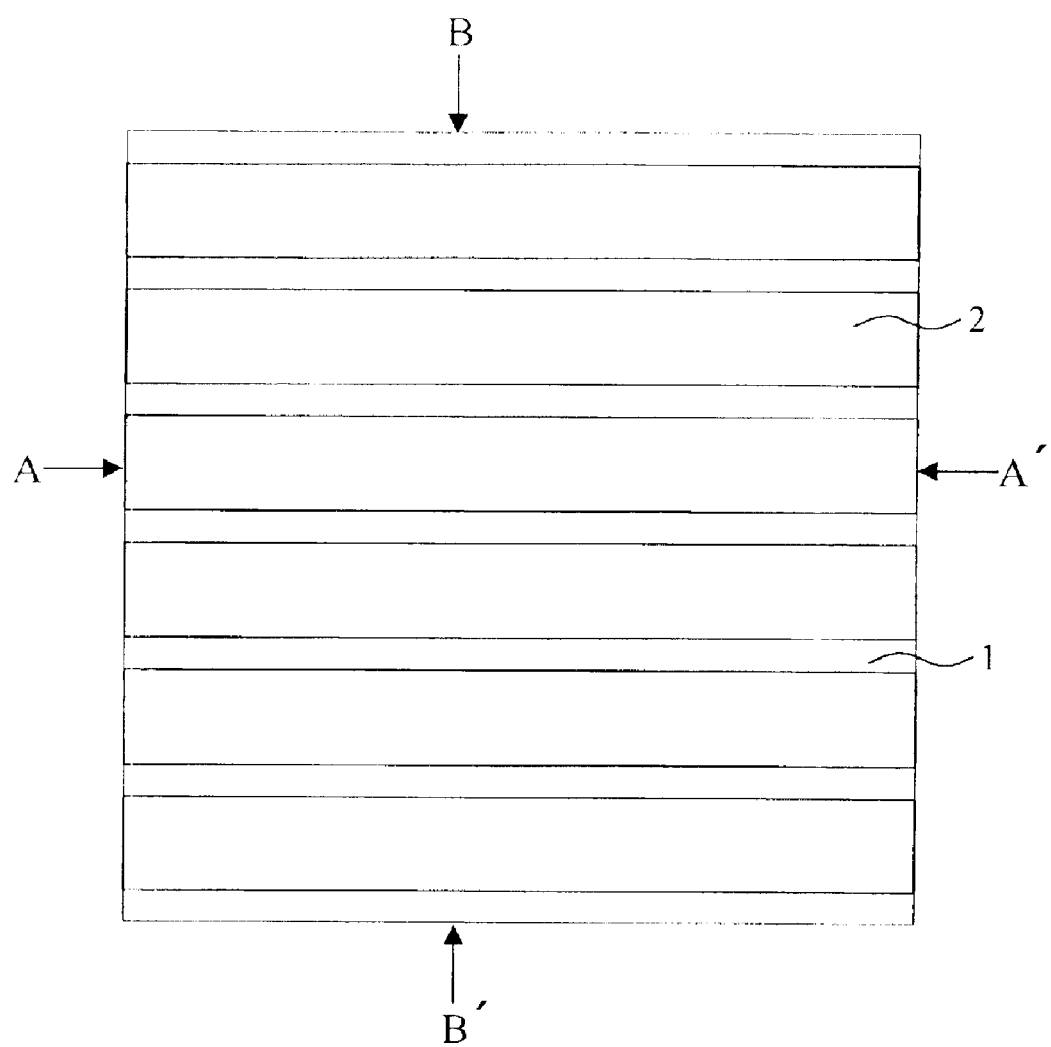
FIGS. 1A to 1C illustrate layouts of an organic EL display according to a related art.
Figure 1B:
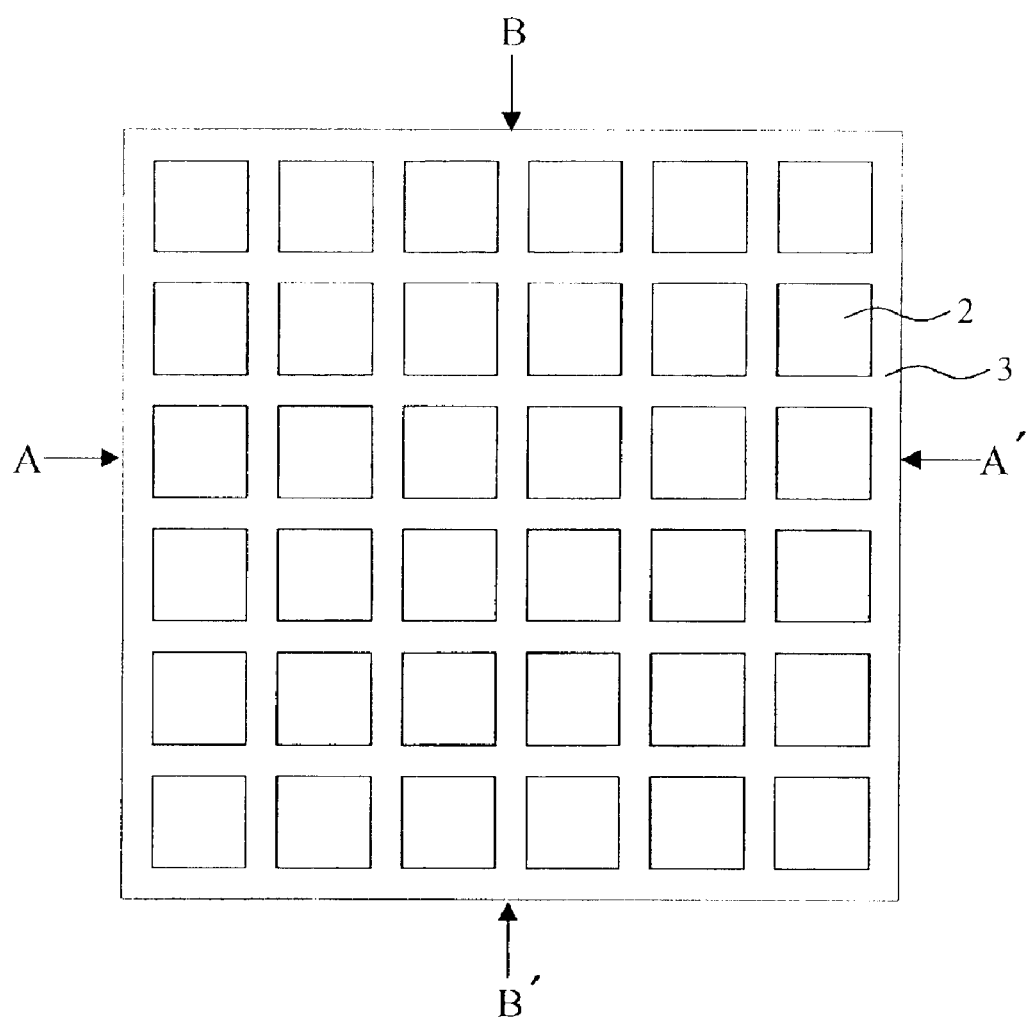
Figure 1C:
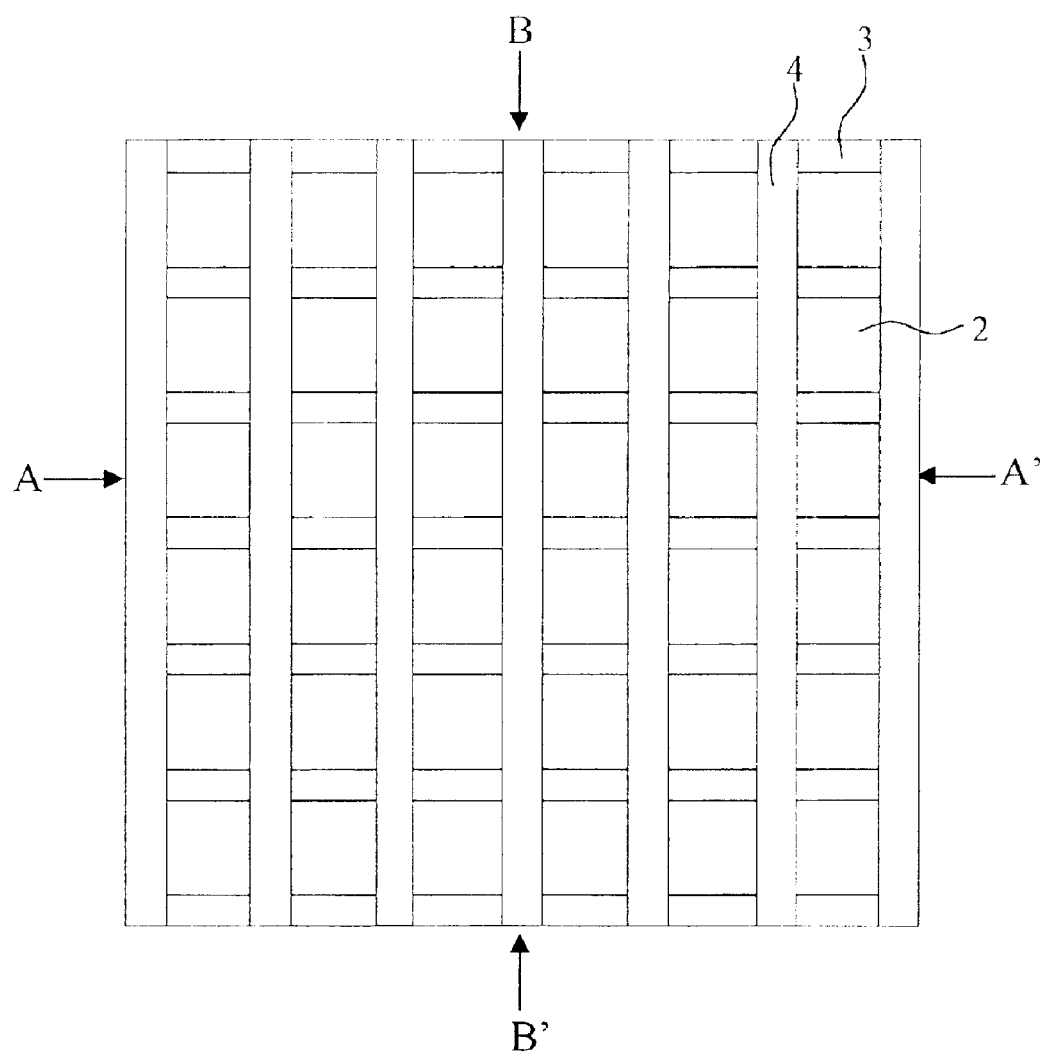
Figure 2A:
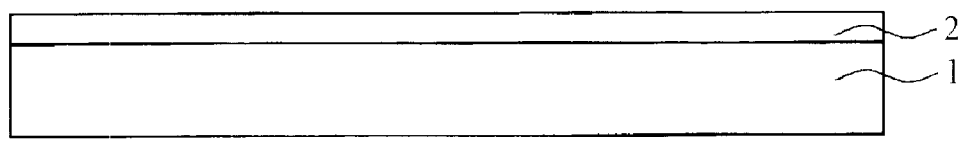
FIGS. 2A to 2C illustrate cross-sectional views of a method of fabricating an organic EL display along cutting lines A–A' in FIGS. 1A to 1C according to a related art.
Figure 2B:
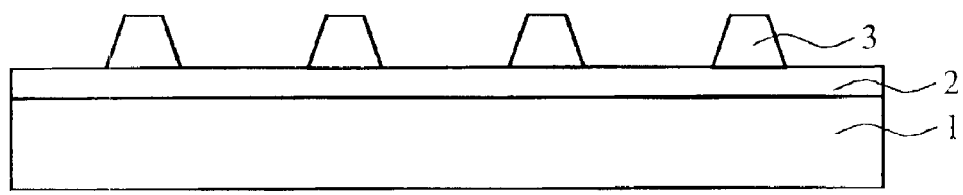
Figure 2C:
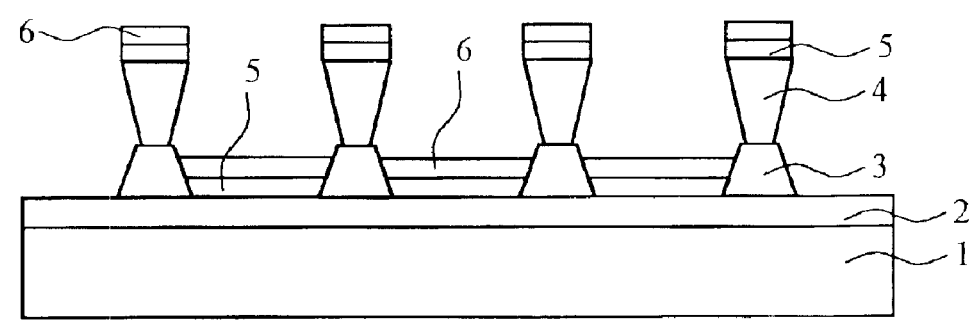
Figure 3A:
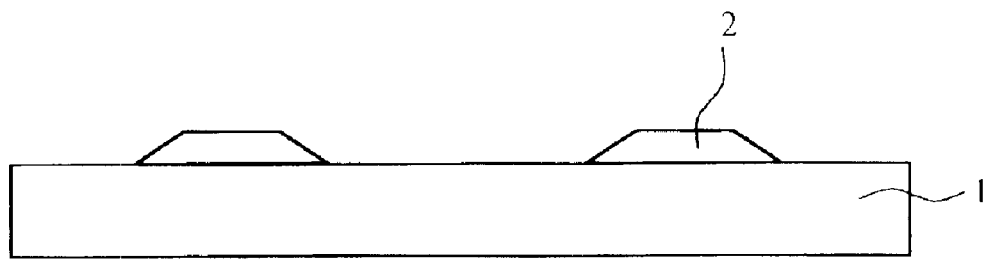
FIGS. 3A to 3C illustrate cross-sectional views of a method of fabricating an organic EL display along cutting lines B–B' in FIGS. 1A to 1C according to a related art.
Figure 3B:
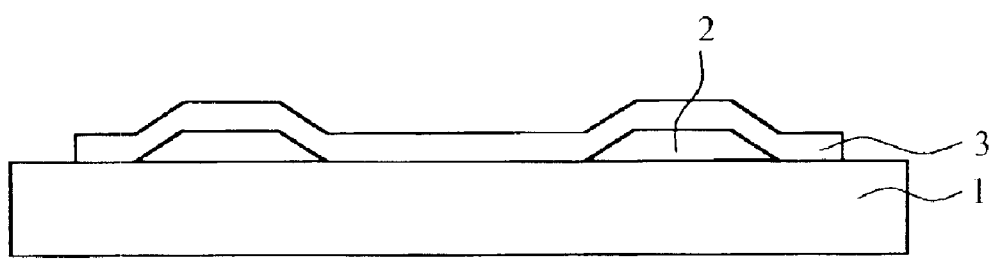
Figure 3C:
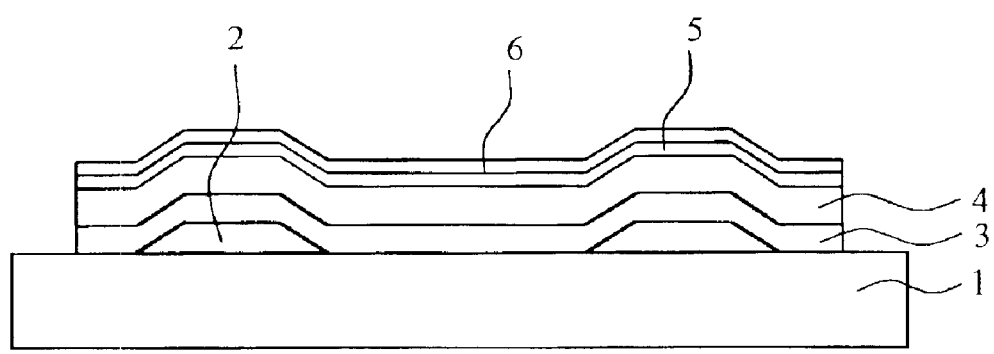
Figure 4A:
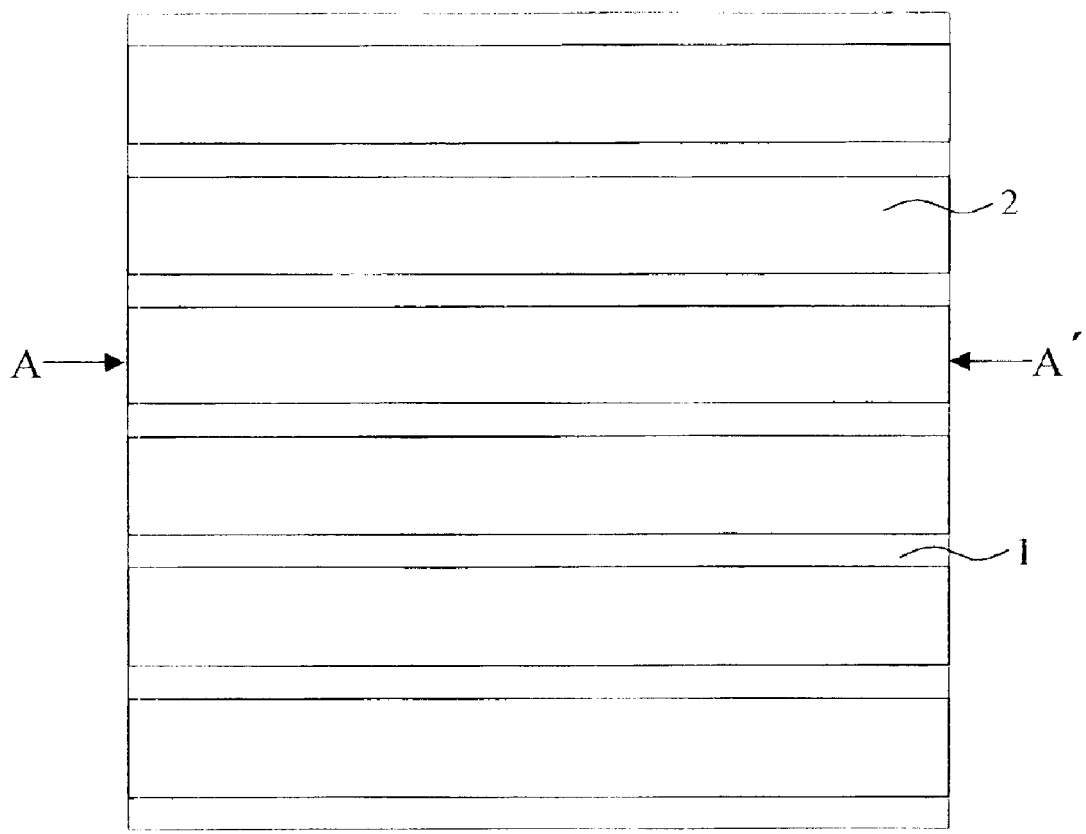
FIGS. 4A to 4C illustrate layouts of an organic EL display according to another related art.
Figure 4B:
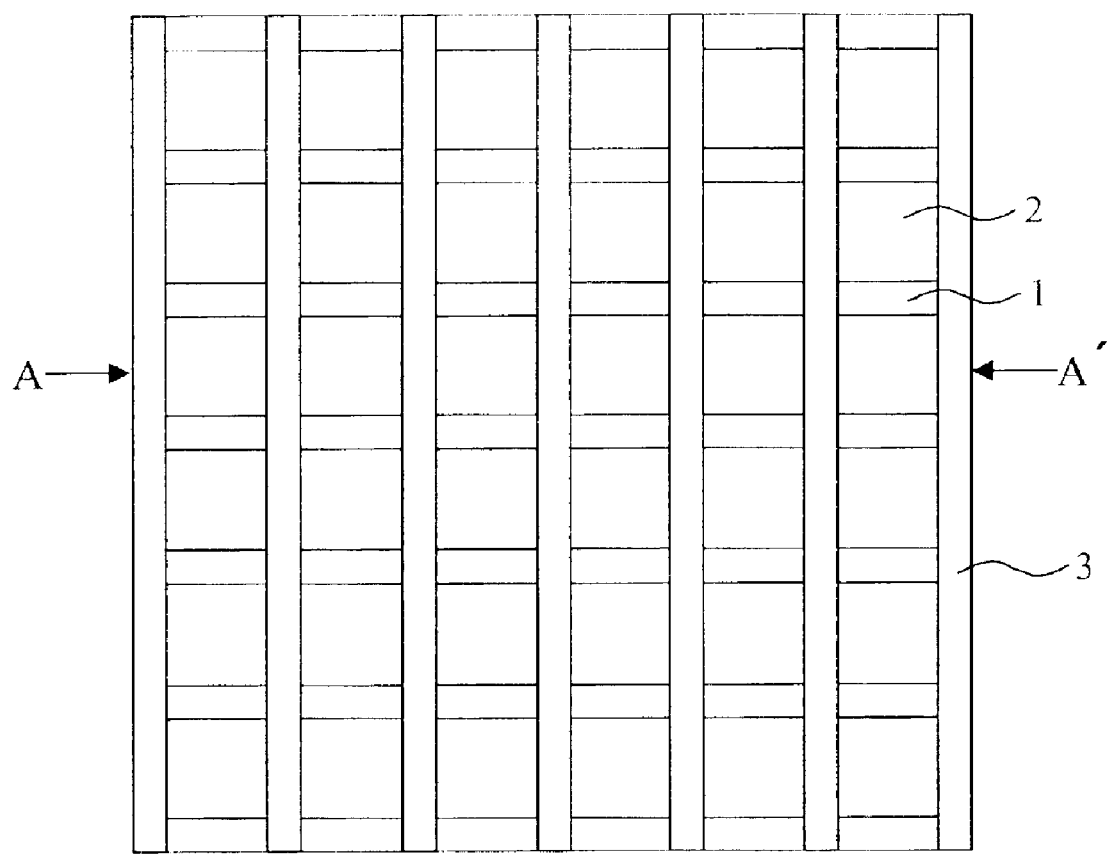
Figure 4C:
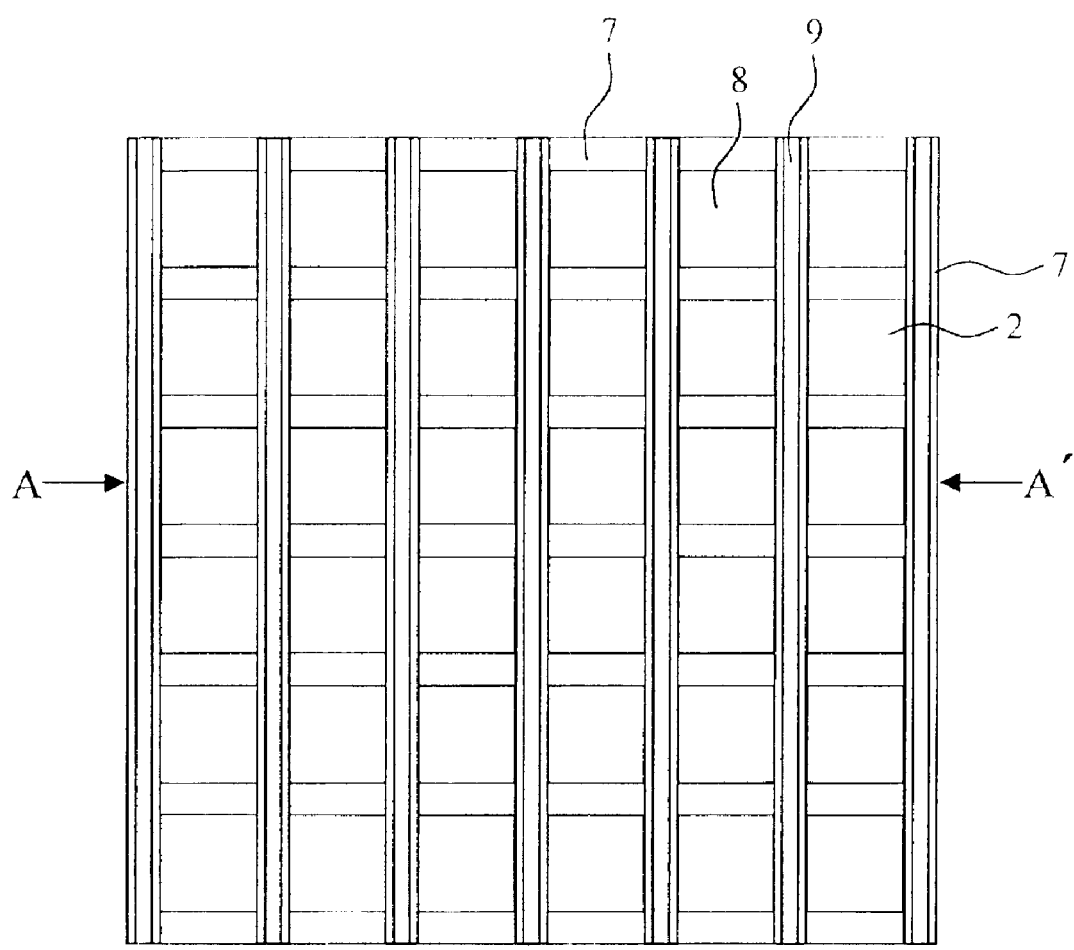
Figure 5A:
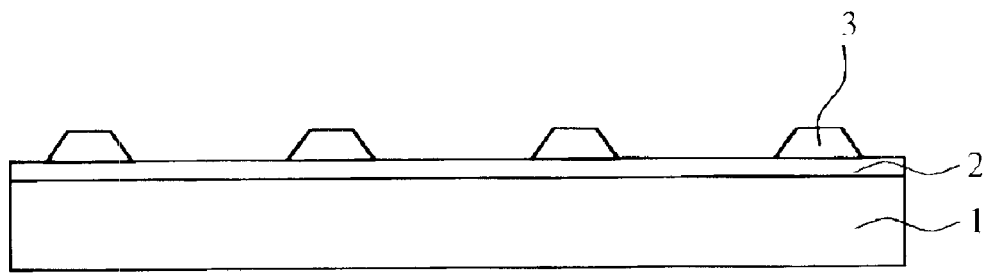
FIGS. 5A to 5C illustrate cross-sectional views of a method of fabricating an organic EL display along cutting lines A–A' in FIGS. 4A to 4C according to another related art.
Figure 5B:
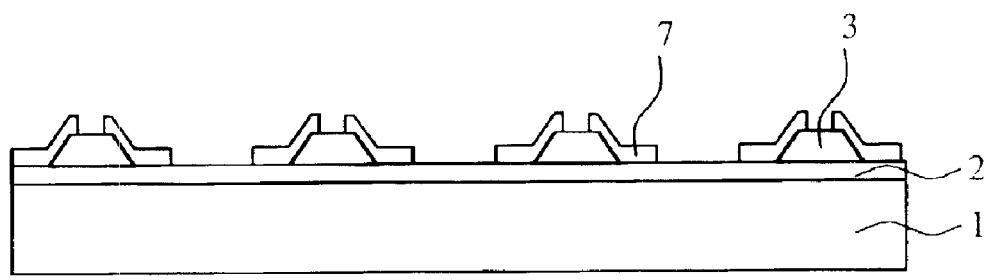
Figure 5C:
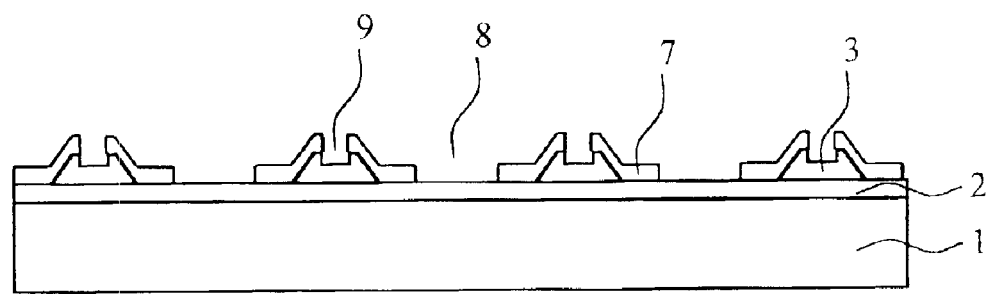
Figure 6A:
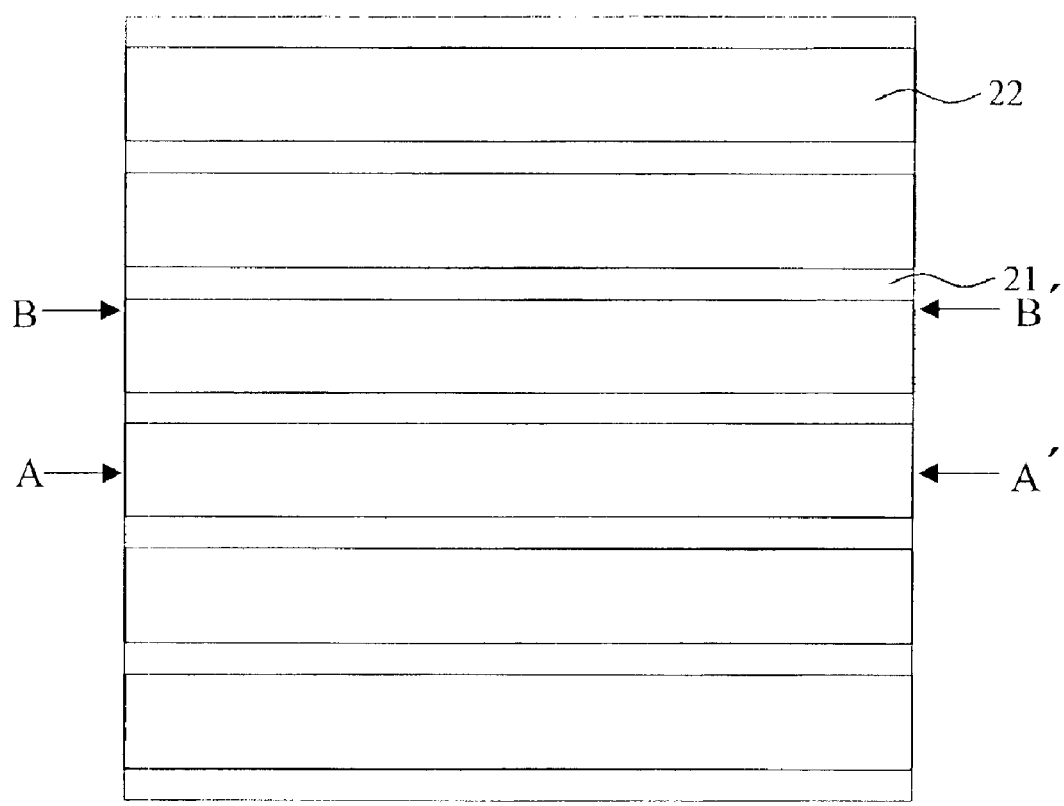
FIGS. 6A to 6C illustrate layouts of an organic EL display according to a first embodiment of the present invention.
Figure 6B:
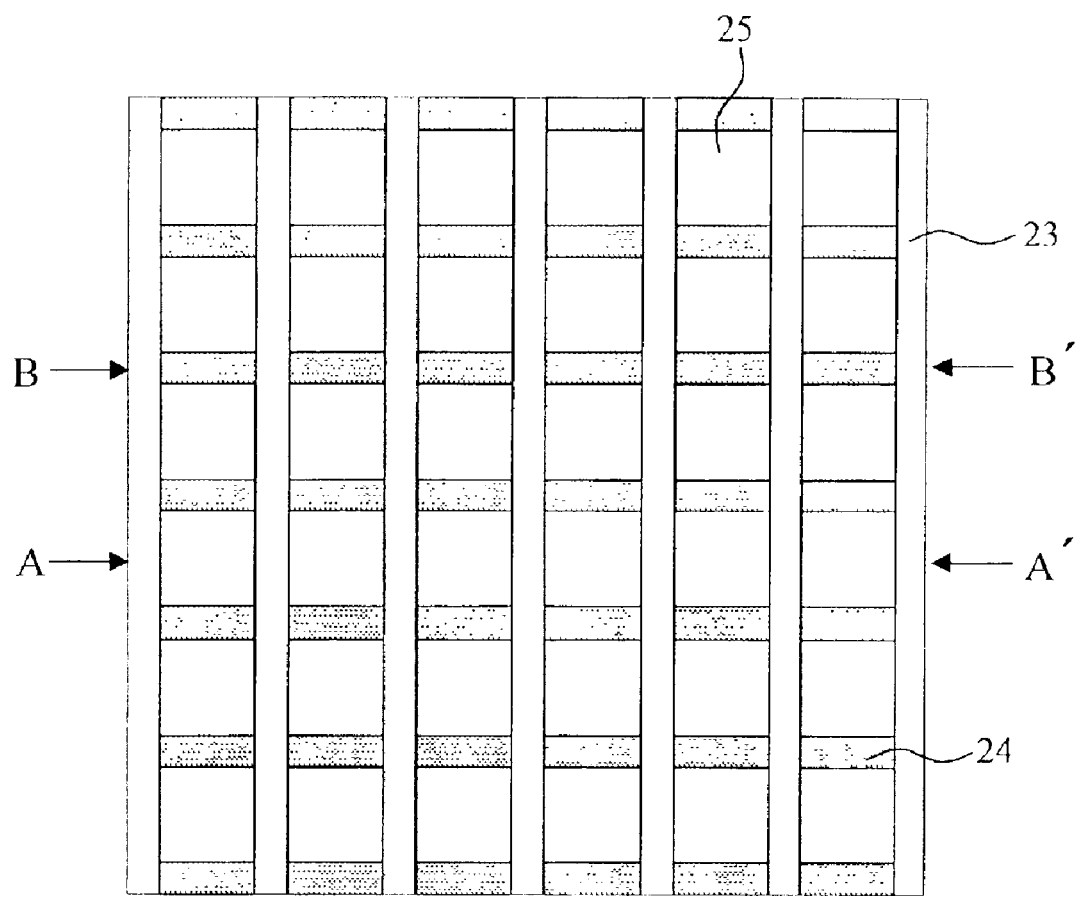
Figure 6C:
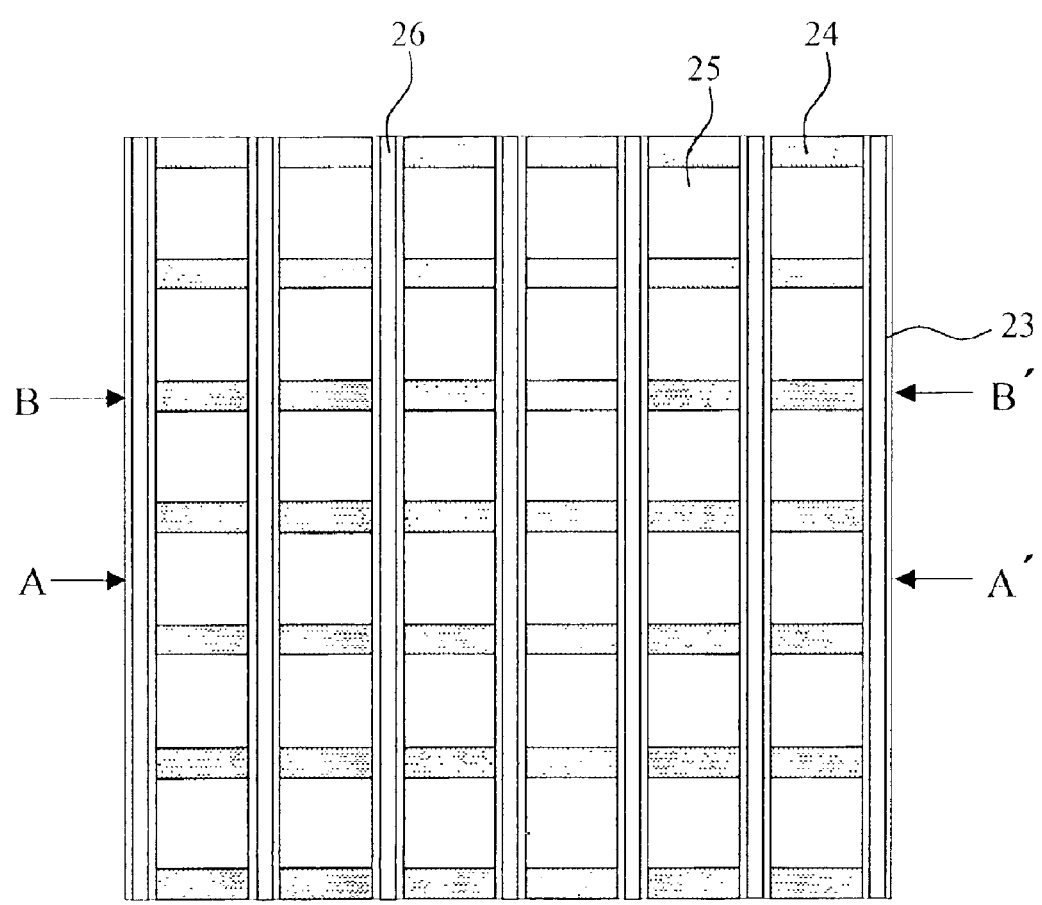

FIGS. 6A to 6C illustrate layouts of an organic EL display according to a first embodiment of the present invention.

Figure 12A:
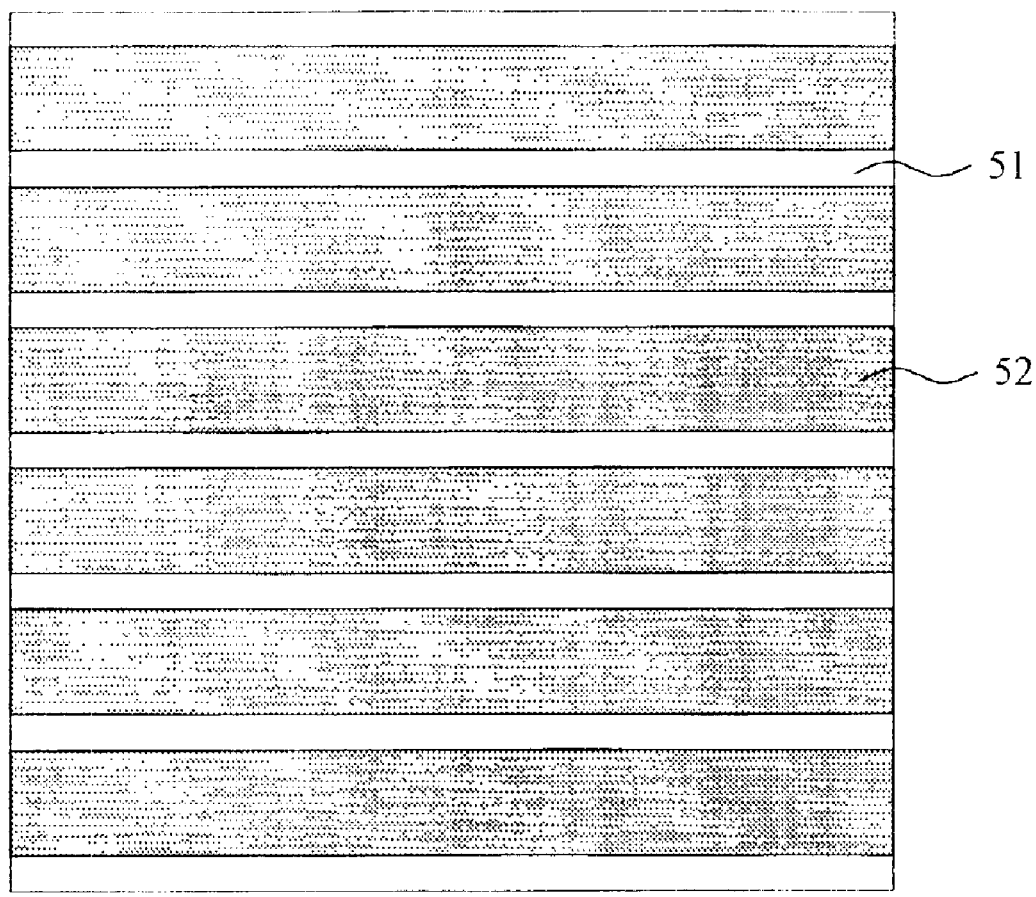
FIGS. 12A to 12C illustrate layouts of exposure masks used for fabricating organic EL displays according to the first and second embodiments of the present invention.

Referring to FIG. 6A, a plurality of stripe type first electrodes 22 formed of ITO(indium tin oxide) or the like are arranged on a transparent substrate 21 using an exposure mask shown in FIG. 12A.

Figure 12B:
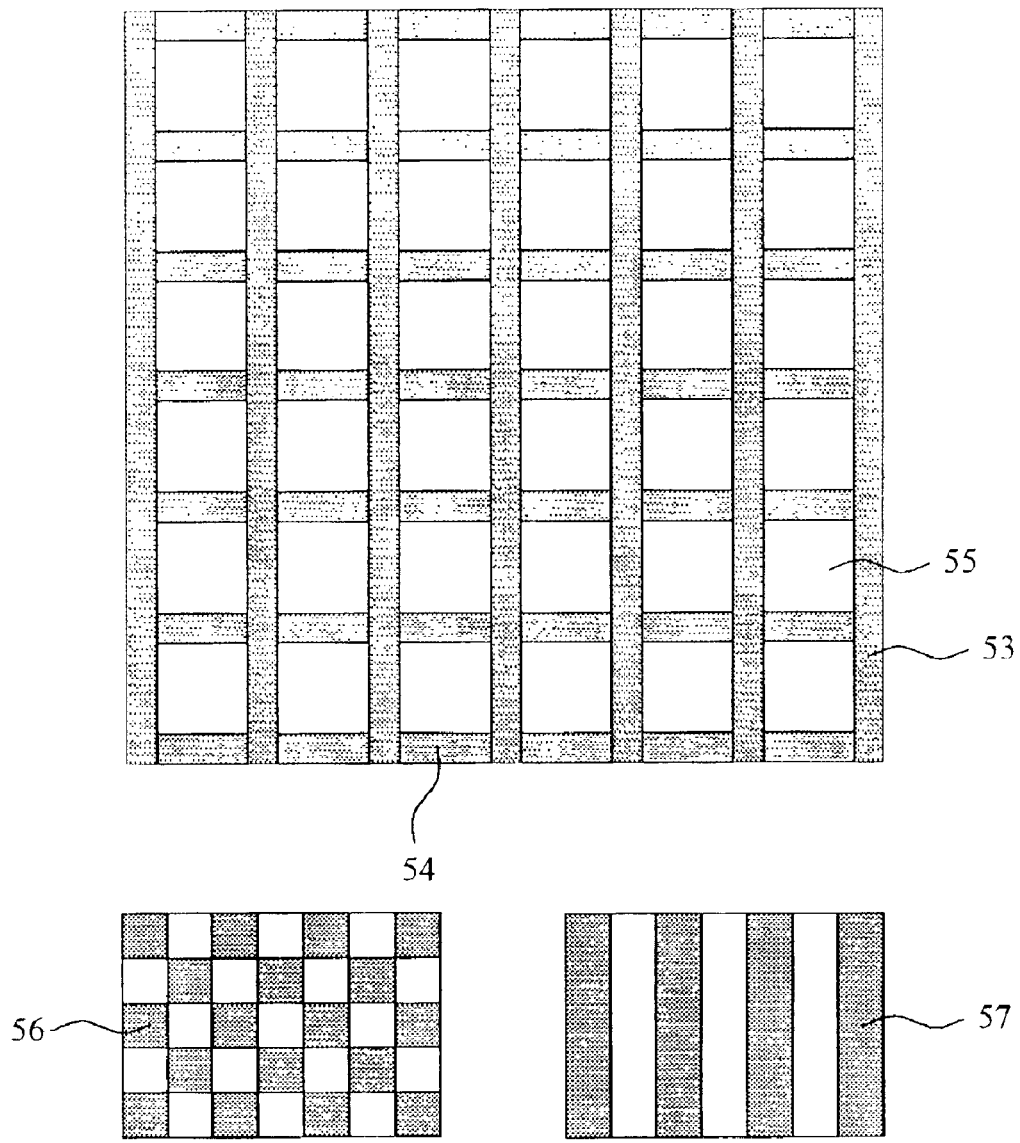

Referring to FIG. 6B, an insulating layer pattern 23 is formed on the first electrodes 22 and transparent substrate 21 using a half-tone mask shown in FIG. 12B so as to lie between a plurality of the first electrodes 22 and cross with a plurality of the first electrodes 22. Thus, openings 25 are formed on the first electrodes 22 so as to expose areas in which pixels are formed, respectively. And, the insulating layer pattern 23 has a lattice shape having the openings 25 in which the pixels are formed respectively.

And, a portion 24 of the insulating layer pattern 23 running on a direction in parallel with the first electrodes 22 is a half tone pattern 24. The half tone pattern 24 is formed to be lower than the other portion of the insulating layer pattern 23 running in a direction vertical to the first electrodes 22 using the exposure mask of normal tone.

The reason why the half tone pattern 24 is formed is that leakage current generated from edges of the first electrodes should be inhibited and that a possibility of disconnection generated from a deposited layer of second electrodes becoming thinner at a boundary between ends of a photoresist layer and the first electrodes 22 should be excluded. In this case, the second electrodes are formed in a direction vertical to the first electrodes 22.

Figure 12C:
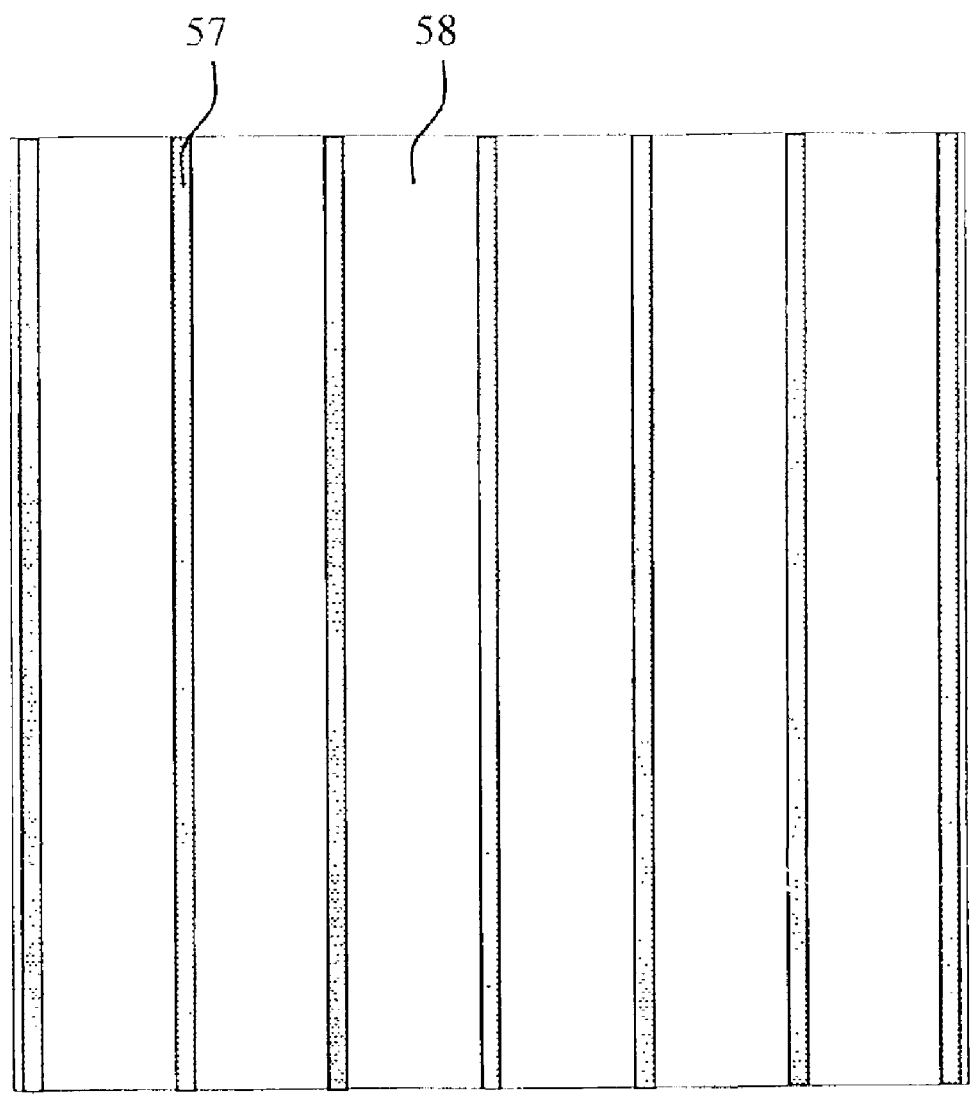

Referring to FIG. 6C, a trench 26 is formed in each middle portion of the insulating pattern 23 stacked in a direction vertical to the first electrodes 22 using a normal tone exposure mask shown in FIG. 12C, and preferably, a half tone exposure mask. In this case, a predetermined portion of a photoresist layer is made to remain after development. If the normal tone exposure mask is used, a portion of the photoresist layer is left by controlling a development time.

The trench 26 has a function of preventing short-circuit between the second electrodes adjacent to each other. Although not shown in the drawing, an organic EL layer and second electrodes(cathode layer) are stacked on the first electrodes 22 including the openings 25.

Figure 7A:
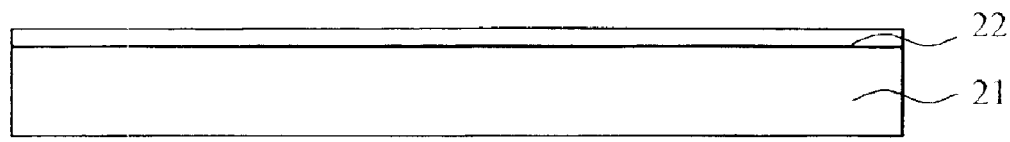
FIGS. 7A to 7C illustrate cross-sectional views of a method of fabricating an organic EL display along cutting lines A–A' in FIGS. 6A to 6C according to a first embodiment of the present invention.
Figure 7B:
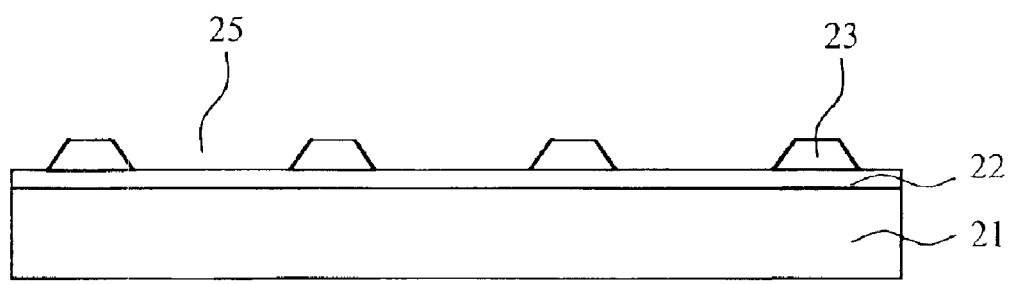
Figure 7C:
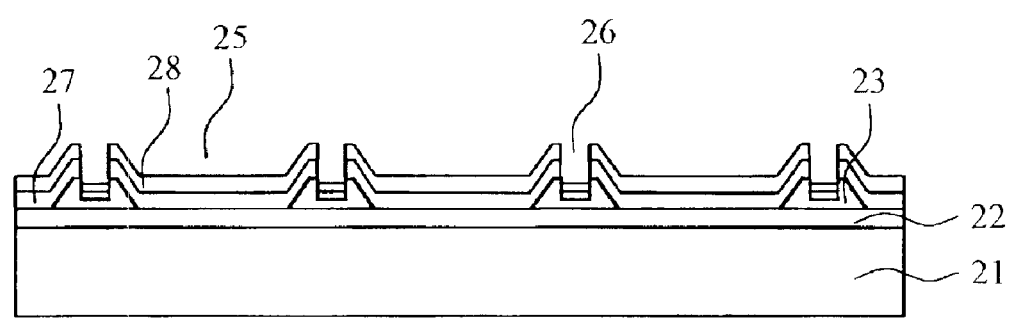

FIGS. 7A to 7C illustrate cross-sectional views of a method of fabricating an organic EL display along cutting lines A–A' in FIGS. 6A to 6C according to a first embodiment of the present invention.

Since the cutting line A–A' passes the openings 25, a half tone pattern 24 in the openings fails to show up in cross-sectional views in FIG. 7B and FIG. 7C.

Referring to FIG. 7A, a transparent substrate 21 is prepared. The transparent substrate 21 is preferably formed of one of glass, quartz, plastics, and the like. An anode layer is stacked 1,000~3,000 Å thick on the transparent substrate 21 by depositing ITO(indium tin oxide), IZO(indium zinc oxide), IXO or the like. A sheet resistance of the anode layer is made to be equal to or lower than $10\Omega/cm^2$. The anode layer is stacked on the cleaned transparent substrate 21 by vacuum deposition such as sputtering, CVD(chemical vapor deposition) or the like. Successively, a photoresist layer (not shown in the drawing) is coated on the anode layer, exposure is carried out on the photoresist layer using an anode pattern mask, development is carried out on the exposed photoresist layer so as to form a stripe type photoresist pattern (not shown in the drawing), the anode layer is etched using the photoresist pattern, and the photoresist pattern is removed. Thus, stripe type first electrodes 22 are formed.

Referring to FIG. 7B, in order to inhibit leakage current from edges of the first electrodes 22, prevent the possibility of short circuit between the first electrodes 22 and second electrodes 28 that will be formed later, and prevent short circuit between the second electrodes 28 and adjacent other patterns, a process of forming an insulating layer is carried out. The present invention uses a photoresist layer(not shown in the drawing) having an electrically insulating characteristic in order to prevent short circuit between the first electrodes 22 and second electrodes 28 that will be formed later.

A photoresist layer having a characteristic of image reversal is coated on the transparent substrate 21 having the first electrodes formed thereon. The photoresist layer is formed 1~5 $\mu$m thick, and preferably, 3~5 $\mu$m thick. AZ 5214E is used for the photoresist layer. This photoresist layer basically has a property of positive photosensitivity. Yet, once the flood exposure is carried out on the photoresist layer heated at a constant temperature, generally over 110° C., the property of positive photosensitivity is changed into that of negative photosensitivity.

After the photoresist layer has been coated, prebaking is carried out at 100° C. for about 60 seconds so as to dry the photoresist layer. And, an insulating layer pattern 23 is formed using a half tone exposure mask like that shown in FIG. 12B. In this case, the insulating layer pattern 23 in a direction in parallel with the first electrodes 22, as shown in FIG. 6B, is a half tone pattern 24, and is formed selectively to leave a predetermined interval from each other. The half tone pattern 24 is formed to be lower than other portions of the insulating layer pattern 23. And, the half tone pattern 24 is preferably under 2 $\mu$m thick. A thickness of the half tone pattern 24 can be controlled by adjusting an opening ratio of a half tone area of the half tone exposure mask shown in FIG. 12B.

The insulating layer in parallel with the first electrodes 22 is formed with the half tone pattern 24 so as to reduce a thickness of the photoresist layer. This is for excluding the possibility of disconnection of the second electrodes 28 at a boundary between edges of the photoresist layer and the first electrodes 22 formed in a direction vertical to that of the first electrodes 22 since a layer thickness of the second electrodes 28 becomes thinner at the boundary on deposition. After exposure, development is carried out so as to realize the insulating layer pattern 23.

Referring to FIG. 7C, after completion of development, a dry process such as air knife or spin dry is carried out on the transparent substrate 21 at a temperature lower than 100° C. And, a second exposure process is carried out using a mask for forming trenches for separation of second electrodes as shown in FIG. 12C. After completion of the second exposure process, reversal baking is carried out for about 140 seconds at 120° C. Flood exposure is then carried out so as to change the property of the photoresist layer. Since the reversal baking for image reversal after exposure and the flood exposure are carried out, the property of the photoresist layer is changed in a manner that an exposed portion remains but a non-exposed portion is developed.

In the second exposure process, each middle portion of the insulating pattern 23 stacked in a direction vertical to the first electrodes 22 fails to be exposed with a width narrower than that of the insulating layer pattern 23. Or, the middle portion of the insulating layer pattern 23 is exposed to a small quantity when the half tone mask is used. And, the rest portions of the insulating layer pattern 23 are exposed.

A trench 26 is formed at each of the middle portions of the insulating layer pattern 23 stacked in a direction vertical to the first electrodes 22 by a development process. When the trench 26 is formed for adjacent pixels isolation, a depth of the trench 26 is preferably greater than a sum of the deposition thickness of the organic EL layer 27 and second electrode 28 that are deposited later. Specifically, the depth of the trench 26 is at least twice greater than the total thickness of the organic EL layer 27 and second electrode 28. In the present invention, the trench is formed about 2 $\mu$m deep.

Moreover, a predetermined amount of the photoresist layer should remain at the bottom of the trench so as to prevent short circuit between the first electrodes through metal of the second electrodes deposited inside the trench. Hence, a pattern of the mask for forming the trench is preferably a half tone type. If the mask is a normal tone, a predetermined portion of the photoresist layer is left by controlling a development time. And, the remaining thickness of the photoresist layer is preferably over 0.5 $\mu$m.

Subsequently, the transparent substrate 21 undergoes a post-baking process so as to be transferred inside a vacuum deposition apparatus for forming an organic EL layer 27. And, an organic EL layer is stacked on the transparent substrate 21 including the insulating layer pattern 23. In this case, the organic EL layer 27 is formed of one of fluorescent low molecular materials such as $Alq_3$ and anthracene, phosphorescent low molecular materials such as iridium coordination compounds such as $Ir(ppy)_3$ and their derivatives, and high molecular organic luminescent materials such as PPV[(poly(phenylenevinylene)], PT(polythiophene), etc. and their derivatives. The low molecular based material is patterned by thermal evaporation using a shadow mask installed inside a chamber. And, the high molecular based material is patterned by spin coating, transcription, ink jet, or the like so as to be formed at a designed position.

When the small molecular based material is used, injection and transport efficiencies of holes from the anode are increased by forming a hole injection layer and a hole transport layer on the hole injection layer before the formation of the organic EL layer 27 as well as an injection efficiency of electrons from the cathode is improved by forming electron transport and injection layers on the organic EL layer. When a hole injection electrode having a high work function is used, the hole injection layer is an organic film having properties of enabling to have massive holes injected therein as well as let the injected hole move therein. And, the hole injection layer is the organic film having properties of enabling to prohibit electrons from being injected therein as well as prevent the electrons from moving therein even if being injected. Moreover, when an electron injection electrode having a low work function is used, the electron transport layer is an organic film having properties of enabling to have massive electrons injected therein as well as let the injected electrons move therein. And, the electron transport layer is the organic film having properties of enabling to prohibit holes from being injected therein as well as prevent the holes from moving therein even if being injected.

When the high molecular based material is used, unlike the case of the low molecular based material, a double structure constituted with buffer and organic EL layers is formed between anode and cathode layers.

Figure 13A:
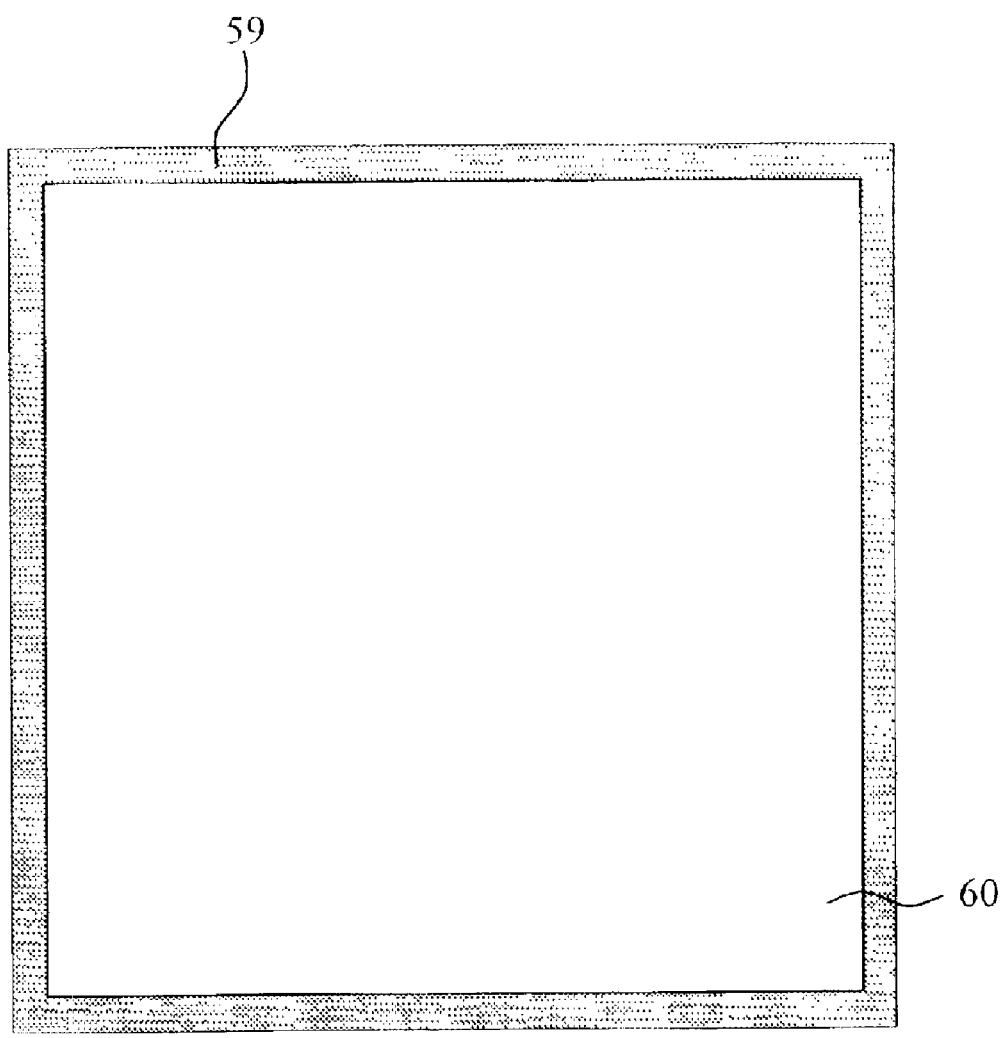
FIG. 13A and FIG. 13B illustrate layouts of shadow masks used for fabricating organic EL displays according to the first and second embodiments of the present invention.

Second electrodes 28 are formed on the transparent substrate 21 including the organic EL layer 27 using a frame mask as a shadow mask having a pattern opening a device area in FIG. 13A. The second electrodes 28 mainly use a metal having an excellent electric conductivity such as Al, Li/Al, MgAg, Ca, or the like, and are stacked by vacuum deposition such as sputtering, electron beam, thermal evaporation, or the like. And, In order to protect the organic EL layer vulnerable to moisture and oxygen, an encapsulation layer formed of metal, glass, or the like or a passivation layer formed of inorganic or organic material is formed on the transparent substrate 21 including the second electrodes 28 so as to make the organic EL layer airtight from outside.

Figure 8A:
FIGS. 8A to 8C illustrate cross-sectional views of a method of fabricating an organic EL display along cutting lines B–B' in FIGS. 6A to 6C according to a first embodiment of the present invention.
Figure 8B:
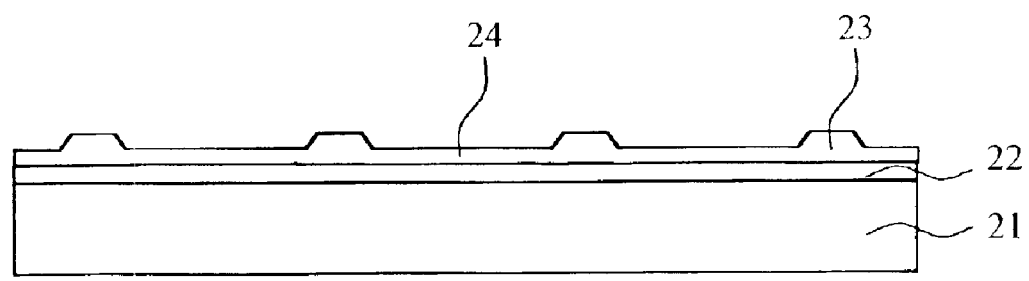
Figure 8C:
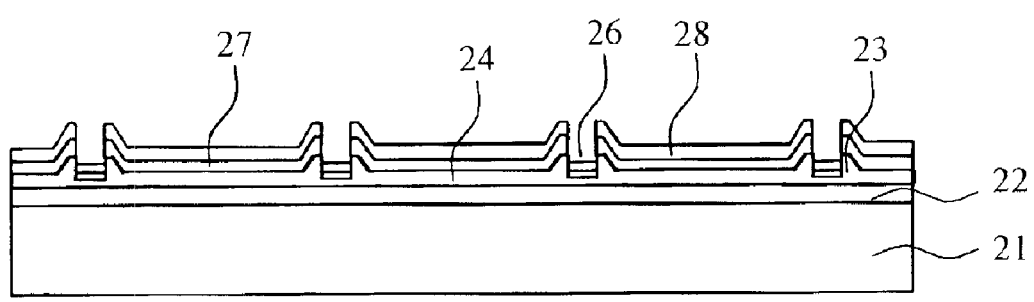

FIGS. 8A to 8C illustrate cross-sectional views of a method of fabricating an organic EL display along cutting lines B–B' in FIGS. 6A to 6C according to a first embodiment of the present invention.

Unlike FIG. 7, since the cutting line fails to traverse the opening 25, cross-sectional views in FIG. 8B and FIG. 8C show that a half tone pattern 24 is formed thinner than other insulating layer pattern 23.

A method of fabricating an organic EL display according to a second embodiment of the present invention is explained in detail as follows.

Figure 9A:
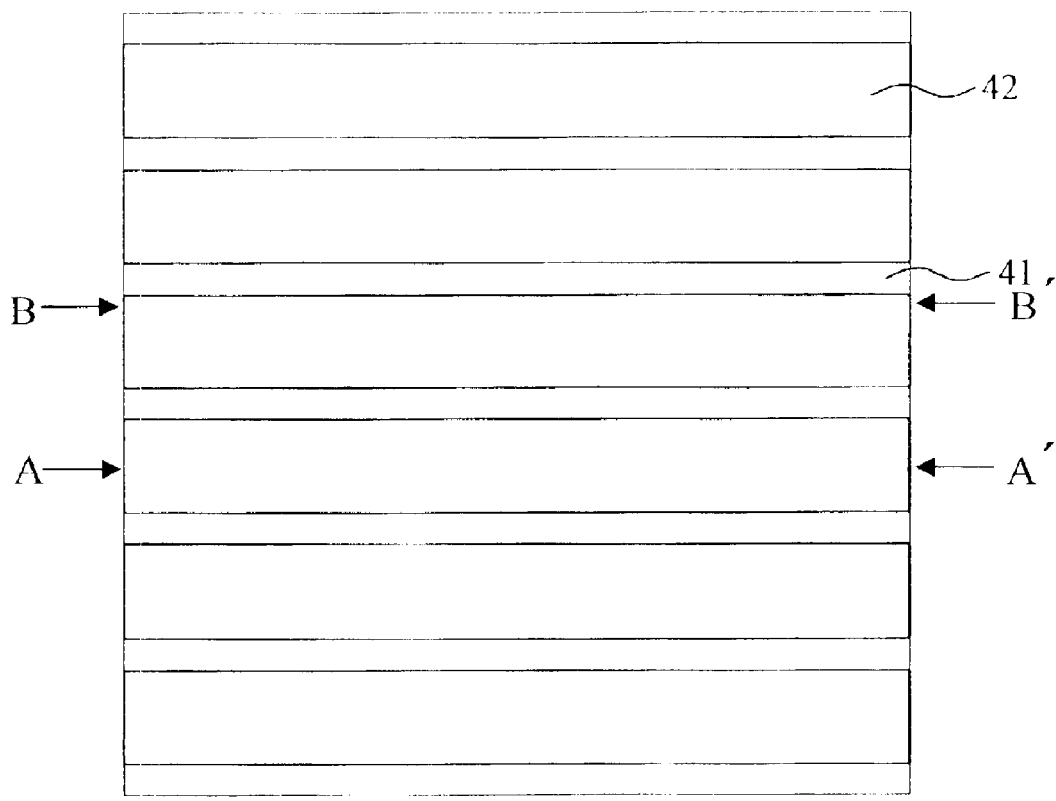
FIG. 9A and FIG. 9B illustrate layouts of an organic EL display according to a second embodiment of the present invention.
Figure 9B:
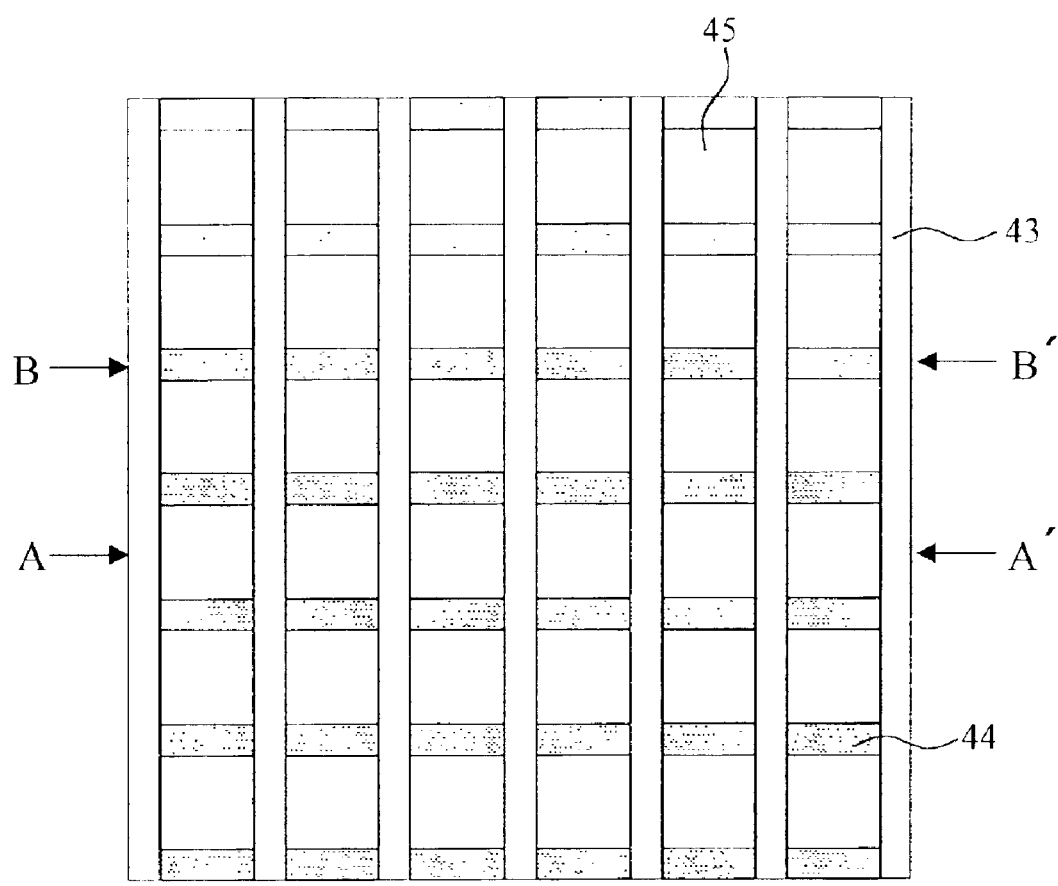

FIG. 9A and FIG. 9B illustrate layouts of an organic EL display according to a second embodiment of the present invention.

Referring to FIG. 9A, a plurality of stripe type first electrodes 42 formed of ITO(indium tin oxide) or the like are arranged on a transparent substrate 41 using an exposure mask shown in FIG. 12A.

Referring to FIG. 9B, an insulating layer pattern 43 is formed on the first electrodes 42 and transparent substrate 41 using a half-tone mask shown in FIG. 12B so as to lie between a plurality of the first electrodes 42 and cross with a plurality of the first electrodes 42. Thus, openings 45 are formed on the first electrodes 42 so as to expose areas in which pixels are formed, respectively. And, the insulating layer pattern 43 has a lattice shape having the openings 45 in which the pixels are formed respectively.

And, a portion 44 of the insulating layer pattern 43 running on a direction in parallel with the first electrodes 42 is a half tone pattern 44. The half tone pattern 44 is formed to be lower than the other portion of the insulating layer pattern 43. The reason why the half tone pattern 44 is formed is that a possibility of disconnection generated from a deposited layer of second electrodes(not shown in the drawing) becoming thinner at a boundary between ends of a photoresist layer and the first electrodes 42 should be excluded. In this case, the second electrodes are formed in a direction vertical to the first electrodes 42.

FIGS. 10A to 10D illustrate cross-sectional views of a method of fabricating an organic EL display along cutting lines A–A' in FIG. 9A and FIG. 9B according to a second embodiment of the present invention.

Figure 10A:
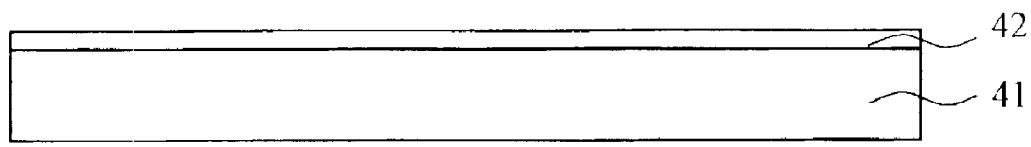
FIGS. 10A to 10D illustrate cross-sectional views of a method of fabricating an organic EL display along cutting lines A–A' in FIG. 9A and FIG. 9B according to a second embodiment of the present invention.
Figure 10B:
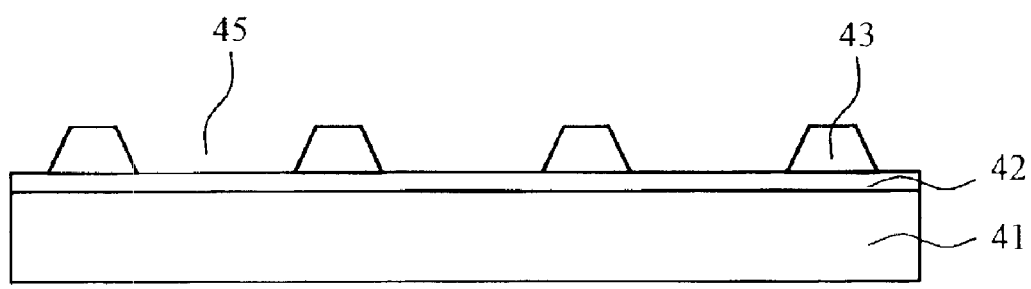
Figure 10C:
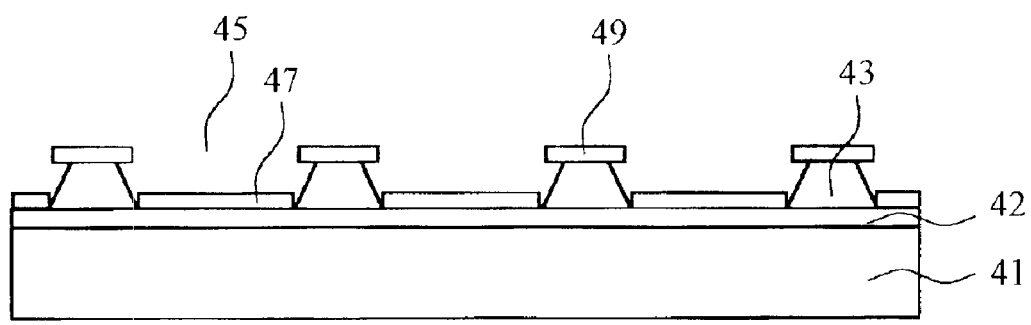

Since the cutting line A–A' passes the openings 45, a half tone pattern 44 in areas of the openings 45 fails to show up in cross-sectional views in FIG. 10B and FIG. 10C.

Referring to FIG. 10A, a transparent substrate 41 is prepared. The transparent substrate 41 is preferably formed of one of glass, quartz, plastics, and the like. An anode layer(not shown in the drawing) is stacked 1,500~2,000 Å thick on the transparent substrate 41 by depositing ITO (indium tin oxide), IZO(indium zinc oxide), IXO or the like. A sheet resistance of the anode layer is made to be equal to or lower than $10\Omega/cm^2$. The anode layer is stacked on the cleaned transparent substrate 21 by sputtering or the like. Successively, a photoresist layer(not shown in the drawing) is coated on the anode layer, exposure is carried out on the photoresist layer using a mask, development is carried out on the exposed photoresist layer so as to form a stripe type photoresist pattern(not shown in the drawing), the anode layer is etched using the photoresist pattern, and the photoresist pattern is removed. Thus, stripe type first electrodes 42 are formed.

Referring to FIG. 10B, in order to inhibit leakage current from edges of the first electrodes 42, prevent the possibility of short circuit between the first electrodes 42 and second electrodes 48 that will be formed later, and prevent short circuit between the second electrodes 48, a process of forming an insulating layer is carried out. The present invention uses a photoresist layer (not shown in the drawing) having an electrically insulating characteristic.

A photoresist layer is coated on the transparent substrate 41. The photoresist layer is formed 1~5 $\mu$m thick, and preferably, 3~5 $\mu$m thick. And, an insulating layer pattern 43 is formed using a half tone exposure mask(not shown in the drawing). In this case, the insulating layer pattern 43 in a direction in parallel with the first electrodes 42, as shown in FIG. 9B, is a half tone pattern 44, and is formed selectively. The half tone pattern 44 is formed to be lower than other portions of the insulating layer pattern 43 using a half tone exposure mask by means of controlling an exposure amount. And, the half tone pattern 44 is preferably under 2 $\mu$m thick. A thickness of the half tone pattern 44 can be controlled by adjusting an opening ratio of a half tone area by a pattern drawn on the exposure mask.

The insulating layer in parallel with the first electrodes 42 is formed with the half tone pattern 44 so as to reduce a thickness of the photoresist layer. This is for excluding the possibility of disconnection of the second electrodes 48 at a boundary between edges of the photoresist layer and the first electrodes 42 formed in a direction vertical to that of the first electrodes 42 since a layer thickness of the second electrodes (not shown in the drawing) becomes thinner at the boundary on deposition.

Referring to FIG. 10C, the transparent substrate 41 is transferred inside a vacuum deposition apparatus for forming an organic EL layer 47. The organic EL layer 47 is formed on the first electrodes 42 through the openings 45 using the insulating layer pattern 43 as a support of a first shadow mask 49. The insulating layer pattern 43 is used as the support so as to adhere closely to the first shadow mask 49 without causing any damage on the first electrodes 42. Hence, it is able to prevent lateral diffusion of the organic EL layer 47.

In this case, the organic EL layer 47 is formed of one of fluorescent low molecular materials such as $Alq_3$ and anthrancene, phosphorescent low molecular materials such as iridium coordination compounds such as $Ir(ppy)_3$ and their derivatives, and high molecular organic luminescent materials such as PPV[poly(phenylenevinylene)], PT(polythiophene), etc. and their derivatives.

Before the formation of the organic EL layer 47, a hole injection layer and a hole transport layer can be stacked.

Moreover, electron transport and injection layers can be formed on the organic EL layer.

When a hole injection electrode having a high work function is used, the hole injection layer is an organic film having properties of enabling to have massive holes injected therein as well as let the injected hole move therein. And, the hole injection layer is the organic film having properties of enabling to prohibit electrons from being injected therein as well as prevent the electrons from moving therein even if being injected. Moreover, when an electron injection electrode having a low work function is used, the electron transport layer is an organic film having properties of enabling to have massive electrons injected therein as well as let the injected electrons move therein. And, the electron transport layer is the organic film having properties of enabling to prohibit holes from being injected therein as well as prevent the holes from moving therein even if being injected.

Figure 10D:
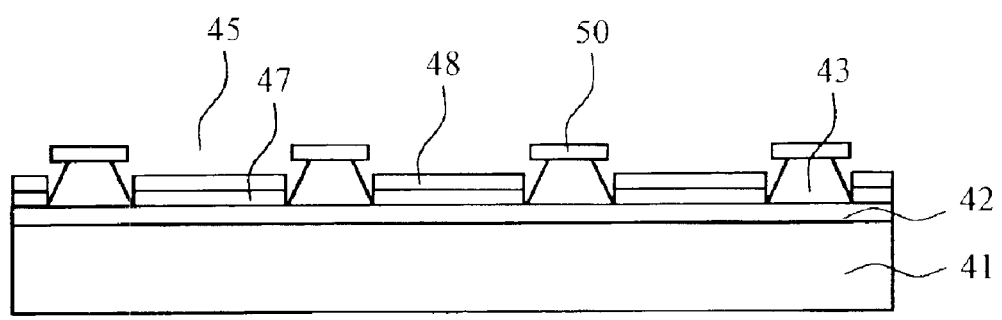

Referring to FIG. 10D, second electrodes 48 are formed on the organic EL layer 47 using the insulating layer pattern 43 as a support of a second shadow mask 50 having a stripe type electrode pattern shown in FIG. 14B. The insulating layer pattern 43 used as the support enables to adhere closely to the second shadow mask 50 without causing any damage on the organic EL layer 47, thereby enabling to prevent lateral diffusion of the second electrodes 48.

The second electrodes 48 mainly use a metal having an excellent electric conductivity such as Al, Li/Al, MgAg, Ca, or the like, and are stacked by vacuum deposition such as sputtering, electron beam, thermal evaporation, or the like. And, in order to protect the organic EL layer 47 vulnerable to moisture and oxygen, an encapsulation layer formed of metal, glass, or the like or a passivation layer formed of inorganic or organic material is formed on the transparent substrate 41 including the second electrodes 48 so as to make the organic EL layer airtight from outside.

FIGS. 11A to 11D illustrate cross-sectional views of a method of fabricating an organic EL display along cutting lines B–B' in FIG. 9A and FIG. 9B according to a second embodiment of the present invention.

Figure 11A:
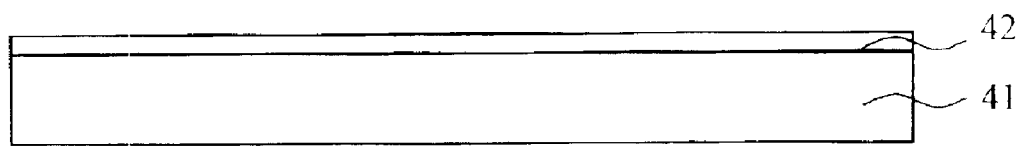
FIGS. 11A to 11D illustrate cross-sectional views of a method of fabricating an organic EL display along cutting lines B–B' in FIG. 9A and FIG. 9B according to a second embodiment of the present invention.
Figure 11B:
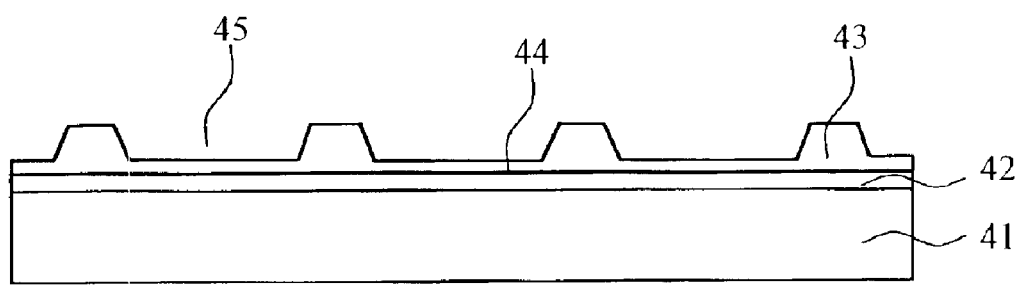
Figure 11C:
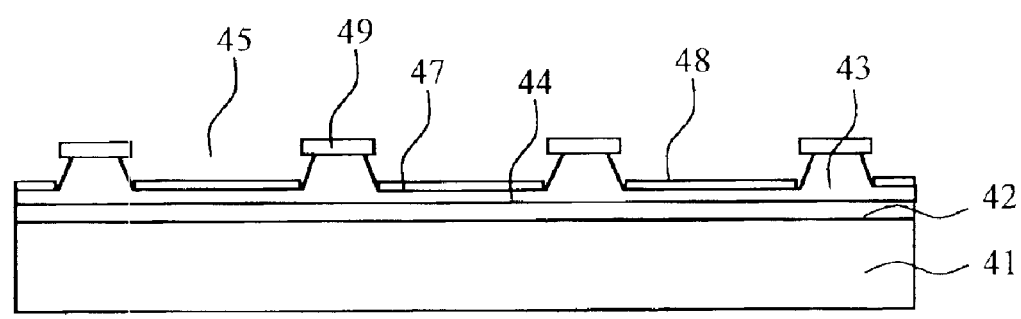
Figure 11D:
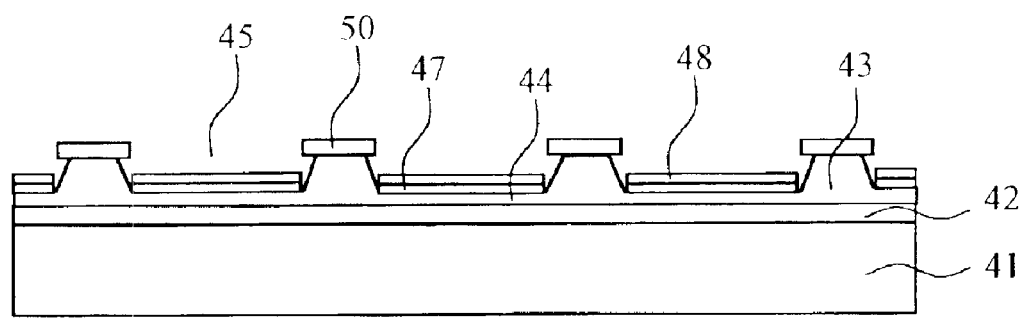

Like FIG. 10, since the cutting line fails to traverse the opening 45 but passes a half tone pattern, cross-sectional views in FIGS. 11B to 11D show that the half tone pattern 44 is formed thinner than other insulating layer pattern 43.

FIGS. 12A to 12C illustrate layouts of exposure masks used for fabricating organic EL displays according to the first and second embodiments of the present invention.

Referring to FIG. 12A, an exposure mask arranges a plurality of the first electrodes 22 or 42 formed of ITO (indium tin oxide) or the like on the transparent substrate 21 or 41. The exposure mask includes a light-transmitting area 51 and a shield area 52 for forming the first electrodes 22 or 42.

Referring to FIG. 12B, a half tone exposure mask forms the lattice type insulating layer pattern 23 or 43 on an area between a plurality of the first electrodes 22 or 42 and on another area crossing with a plurality of the first electrodes 22 or 42. The half tone exposure mask includes a shield area 53 crossing with the first electrodes 22 or 42, a light-transmitting area 55, and a half tone area in parallel with the first electrodes 22 or 42. The half tone area 54 is constituted with rectangular patterns 56 or slit type patterns 57.

Referring to FIG. 12C, an exposure mask forms the trenches 26 in middle portions of the insulating layer pattern stacked in a direction vertical to a plurality of the first electrodes 22, and includes a half tone area 57 and a light-transmitting area 58.

Figure 13B:
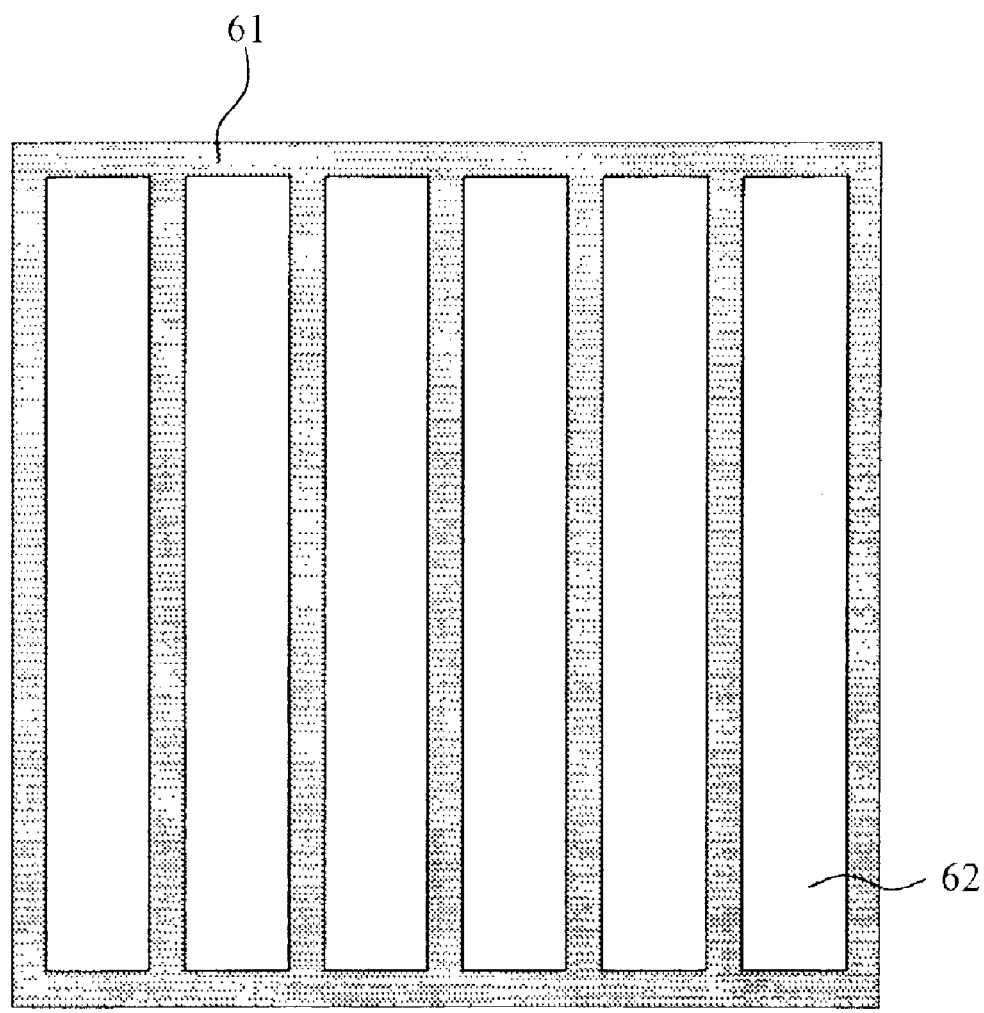

FIG. 13A and FIG. 13B illustrate layouts of shadow masks used for fabricating organic EL displays according to the first and second embodiments of the present invention.

Referring to FIG. 13A, a layout of a shadow mask used in the first embodiment of the present invention is shown. The shadow mask includes a shield area 59 and a deposition material transmitting area 60.

Referring to FIG. 13B, a layout of a shadow mask used in the second embodiment of the present invention is shown. The shadow mask includes a shield area 61 and a deposition material transmitting area 62.

Accordingly, the organic EL display and fabricating method thereof according to the present invention have the following advantages or effects.

Using a single photosensitive layer having an insulating property, leakage current at edges of the anode layer is inhibited, short circuit at a boundary between the anode and cathode layers is inhibited and, a function of preventing short circuit between adjacent patterns in the cathode layer is satisfied. Therefore, the present invention simplifies a fabrication process to reduce a process time as well as reduce a product cost.

Specifically, in the insulating layer pattern formed on the transparent substrate, a portion of the insulating pattern formed on an area in parallel with the anode layer is formed thinner than other portion of the insulating layer pattern. Therefore, the present invention excludes the possibility of disconnection of the cathode layer.

Moreover, an image-reversible organic material from the positive type to the negative type is used for the insulating layer so as to form the trenches in a direction vertical to the anode layer. Therefore, the present invention enables to form a single photosensitive layer performing both functions of the separator and insulating layer.

Besides, compared to the organic EL display forming the separator and insulating layer separately according to the related art, the present invention forms the single insulating layer having both functions of the insulating layer and separator, thereby enabling to increase the aperture ratio.

And, since the insulating layer pattern is used as the support of the shadow mask on forming the cathode layer, the shadow mask enables to adhere closely thereto without causing any damage on the organic EL layer as well as prevent lateral diffusion of the cathode layer.

the forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating an organic electroluminescence display, comprising the steps of:
    forming a plurality of stripe type first electrodes on a transparent substrate;
    stacking an insulating layer pattern on a first area crossing with the first electrodes and a second area in parallel with the first electrodes wherein a half tone pattern is formed on the second area;
    forming a plurality of organic light-emitting layers on a plurality of the first electrodes, respectively; and
    forming a plurality of second electrodes on a plurality of the organic light-emitting layers.

2. The method of claim 1, wherein a half tone area of a mask used for forming the half tone pattern has a shape selected from a group consisting of slit, lattice and chevron.

3. The method of claim 1, wherein a half tone area of a mask used for forming the half tone pattern is formed of a semi-transmitting material having a low transmittance.

4. The method of claim 1, further comprising a step of forming a plurality of trenches on middle portions of the insulating layer pattern vertical to the first electrodes so as to cross with the first electrodes.

5. The method of claim 4, wherein a lateral side of each of the trenches has an overhang structure or a negative profile.

6. The method of claim 4, wherein a pattern of a mask for forming the trenches has a normal or half tone type.

7. The method of claim 1, further comprising the steps of:
    forming a plurality of the organic light-emitting layers on a plurality of the first electrodes using the insulating layer pattern as a support of a first shadow mask; and
    forming a plurality of the second electrodes on a plurality of the organic light-emitting layers using the insulating layer pattern as a support of a second shadow mask.

8. The method of claim 7, wherein a device area of each of the first and second shadow masks has an open structure.

9. The method of claim 7, wherein each of the first and second shadow masks has a plurality of stripe type patterns.

10. The method of claim 9, wherein a plurality of the stripe type patterns of the first and second shadow masks correspond to the insulating layer pattern crossing with a plurality of the first electrodes.

11. The method of claim 1, the step of forming the insulating layer pattern, comprising the steps of:
    coating a photoresist layer on the transparent substrate including the first electrodes wherein the photoresist layer has a property of electrical isolation;
    carrying out exposure and development on the photoresist layer using a first mask so as to form a photoresist pattern on the first and second areas; and
    forming trenches on middle portions of the photoresist pattern on the first area so as to cross with the first electrodes by carrying out exposure on the photoresist pattern using a second mask so as to perform an image reversal of the photoresist pattern and developing the image-reversed photoresist pattern.

12. The method of claim 11, wherein flood exposure is carried out on the photoresist layer having been heated at a temperature over 110° C. so that a property of the photoresist layer is changed into a negative type from a positive type.

13. The method of claim 11, further comprising a step of carrying out pre-baking at 100° C. for about 60 seconds after the photoresist layer has been coated.

14. The method of claim 11, wherein a reversal baking process is carried out for about 140 seconds at 120° C. after the exposure of the photoresist pattern so that the flood exposure is carried out for the image reversal.

15. A method of fabricating an organic electroluminescence display, comprising the steps of:
    forming a plurality of stripe type first electrodes on a transparent substrate;
    forming an insulating layer pattern on the transparent substrate including the first electrodes wherein the insulating layer pattern is stacked on a first area crossing with the first electrodes and a second area in parallel with the first electrodes and wherein the insulating layer pattern on the second area is thinner than that on the first area;
    forming a plurality of organic light-emitting layers on a plurality of the first electrodes, respectively; and
    forming a plurality of second electrodes on a plurality of the organic light-emitting layers.

16. The method of claim 15, wherein an upper portion of the insulating layer pattern on the second area is developed to be removed by controlling an exposure amount by a half tone pattern in an exposure mask and wherein a lower portion of the insulating layer pattern remains so as to have a low thickness selectively.

17. The method of claim 15, further comprising the steps of:
    forming a plurality of the organic light-emitting layers on a plurality of the first electrodes using the insulating layer pattern on the first area as a support of a first shadow mask; and
    forming a plurality of the second electrodes on a plurality of the organic light-emitting layers using the insulating layer pattern on the first area as a support of a second shadow mask.

18. A method of fabricating an organic electroluminescence display, comprising the steps of:
    forming a plurality of stripe type first electrodes on a transparent substrate;
    stacking an insulating layer pattern on a first area crossing with the first electrodes and a second area in parallel with the first electrodes wherein a half tone pattern is formed on the second area;
    forming a plurality of organic light-emitting layers on a plurality of the first electrodes using the insulating layer pattern on the first area as a support of a first shadow mask; and
    forming a plurality of second electrodes on a plurality of the organic light-emitting layers using the insulating layer pattern on the first area as a support of a second shadow mask.

19. The method of claim 18, further comprising a step of forming a plurality of trenches on middle portions of the insulating layer pattern vertical to the first electrodes so as to cross with the first electrodes.

20. The method of claim 19, wherein a lateral side of each of the trenches has a negative profile and the insulating layer pattern is formed of a photosensitive material having a property of an image reversal.

21. The method of claim 19, wherein a pattern of a mask for forming the trenches has a normal or half tone type.

22. A method of fabricating an organic electroluminescence display, comprising the steps of:
    forming a plurality of stripe type first electrodes on a transparent substrate;
    forming a lattice type insulating layer pattern stacked on the transparent substrate and the first electrodes so as to cross with the first electrodes and lie between the first electrodes;
    forming a plurality of trenches on middle portions of the insulating layer pattern vertical to the first electrodes so as to cross with the first electrodes;
    forming a plurality of organic light-emitting layers on a plurality of the first electrodes, respectively; and
    forming a plurality of second electrodes on a plurality of the organic light-emitting layers.

23. The method of claim 22, wherein the insulating layer pattern is formed of a photosensitive material having a property of an image reversal.

* * * * *